US00RE46623E

(19) United States
(12) Reissued Patent
Shim et al.

(10) Patent Number: US RE46,623 E
(45) Date of Reissued Patent: Dec. 5, 2017

(54) PROGRAMMING METHODS FOR THREE-DIMENSIONAL MEMORY DEVICES HAVING MULTI-BIT PROGRAMMING, AND THREE-DIMENSIONAL MEMORY DEVICES PROGRAMMED THEREBY

(71) Applicant: Samsung Electronics Co., Ltd., Gyeonggi-do, Suwon-si (KR)

(72) Inventors: Sunil Shim, Seoul (KR); Sunghoi Hur, Seoul (KR); Kihyun Kim, Hwaseong-si (KR); Hansoo Kim, Suwon-si (KR); Jaehun Jeong, Hwaseong-si (KR)

(73) Assignee: Samsung Electronics Co., Ltd. (KR)

(21) Appl. No.: 14/737,811

(22) Filed: Jun. 12, 2015

Related U.S. Patent Documents

Reissue of:
(64) Patent No.: 8,767,473
Issued: Jul. 1, 2014
Appl. No.: 13/962,451
Filed: Aug. 8, 2013

U.S. Applications:
(63) Continuation of application No. 12/818,285, filed on Jun. 18, 2010, now Pat. No. 8,514,625.

(30) Foreign Application Priority Data

Jun. 19, 2009 (KR) ..... 10-2009-005073

(51) Int. Cl.
*G11C 16/00* (2006.01)
*G11C 16/10* (2006.01)
(Continued)

(52) U.S. Cl.
CPC ..... *G11C 16/10* (2013.01); *G11C 11/5628* (2013.01); *G11C 16/0483* (2013.01); *G11C 16/3427* (2013.01)

(58) Field of Classification Search
CPC . G11C 11/5628; G11C 16/10; G11C 16/3427; G11C 16/0483
See application file for complete search history.

(56) References Cited

U.S. PATENT DOCUMENTS 6,528,896 B2 3/2003 Song et al.
6,710,465 B2 3/2004 Song et al.
(Continued)

FOREIGN PATENT DOCUMENTS

JP 10032269 2/1998
JP 2007103010 4/2007
(Continued)

OTHER PUBLICATIONS

Tanaka, et al., "Bit Cost Scalable Technology with Punch and Plug Process for Ultra high Density Flash Memory", 2007 Symposium on VLSI Technology Digest of Technical Papers.
(Continued)

*Primary Examiner* — Behzad Peikari
(74) *Attorney, Agent, or Firm* — Onello & Mello, LLP

(57) ABSTRACT

In a method of multiple-bit programming of a three-dimensional memory device having arrays of memory cells that extend in horizontal and vertical directions relative to a substrate, the method comprises first programming a memory cell to be programmed to one among a first set of states. At least one neighboring memory cell that neighbors the memory cell to be programmed to one among the first set of states is then first programmed. Following the first programming of the at least one neighboring memory cell, second programming the memory cell to be programmed to one among a second set of states, wherein the second set of states has a number of states that is greater than the number of states in the first set of states.

23 Claims, 17 Drawing Sheets

AMENDED

(51) Int. Cl.

| | |
|---|---|
| ***G11C 11/56*** | (2006.01) |
| *G11C 16/34* | (2006.01) |
| *G11C 16/04* | (2006.01) |

(56) References Cited

U.S. PATENT DOCUMENTS

| | | | | |
|---|---|---|---|---|
| 7,233,024 | B2 * | 6/2007 | Scheuerlein | G11C 7/18 257/390 |
| 7,542,337 | B2 * | 6/2009 | Scheuerlein | G11C 11/56 365/185.03 |
| 7,646,041 | B2 | 1/2010 | Chae et al. | |
| 7,696,559 | B2 | 4/2010 | Arai et al. | |
| 7,843,733 | B2 | 11/2010 | Kim et al. | |
| 7,876,614 | B2 | 1/2011 | Kang et al. | |
| 7,894,293 | B2 * | 2/2011 | Ikeda | G11O 5/025 365/222 |
| 8,048,741 | B2 | 11/2011 | Arai et al. | |
| 8,659,028 | B2 * | 2/2014 | Scheuerlein | G11C 7/18 257/390 |
| 2002/0196649 | A1 | 12/2002 | Song et al. | |
| 2003/0137063 | A1 | 7/2003 | Song et al. | |
| 2007/0058432 | A1 | 3/2007 | Hosono | |
| 2007/0153583 | A1 | 7/2007 | Guterman | |
| 2007/0158736 | A1 | 7/2007 | Arai et al. | |
| 2007/0252201 | A1 | 11/2007 | Kito et al. | |
| 2008/0019185 | A1 | 1/2008 | Li | |
| 2008/0084748 | A1 | 4/2008 | Hemink et al. | |
| 2008/0128757 | A1 | 6/2008 | Chae et al. | |
| 2008/0158952 | A1 | 7/2008 | Aritome | |
| 2008/0239805 | A1 | 10/2008 | Shiga et al. | |
| 2008/0316832 | A1 | 12/2008 | Fong et al. | |
| 2008/0316833 | A1 | 12/2008 | Fong et al. | |
| 2009/0103360 | A1 | 4/2009 | Kang et al. | |
| 2009/0121271 | A1 | 5/2009 | Son et al. | |
| 2010/0046301 | A1 | 2/2010 | Fong et al. | |
| 2010/0054036 | A1 | 3/2010 | Lee et al. | |
| 2010/0159657 | A1 | 6/2010 | Arai et al. | |

FOREIGN PATENT DOCUMENTS

| | | |
|---|---|---|
| JP | 2007180389 | 7/2007 |
| JP | 2008171968 | 7/2008 |
| JP | 2009104763 | 5/2009 |
| JP | 2009522704 | 6/2009 |
| KR | 100423896 | 3/2004 |
| KR | 1020080051014 | 6/2006 |
| WO | 2008157606 | 12/2008 |

OTHER PUBLICATIONS

"Programming Methods for Three-Dimensional Memory Devices Having Multi-Bit Programming, and Three-Dimensional Memory Devices Programmed Thereby" Specification, Drawings, Claims and Prosecution History, of U.S. Appl. No. 12/808,285, filed Jun. 18, 2010, by inventor(s), which is stored in the U.S. Patent and Trademark Office (USPTO) Image File Wrapper (IFW) System.

* cited by examiner

AMENDED
FIG. 1
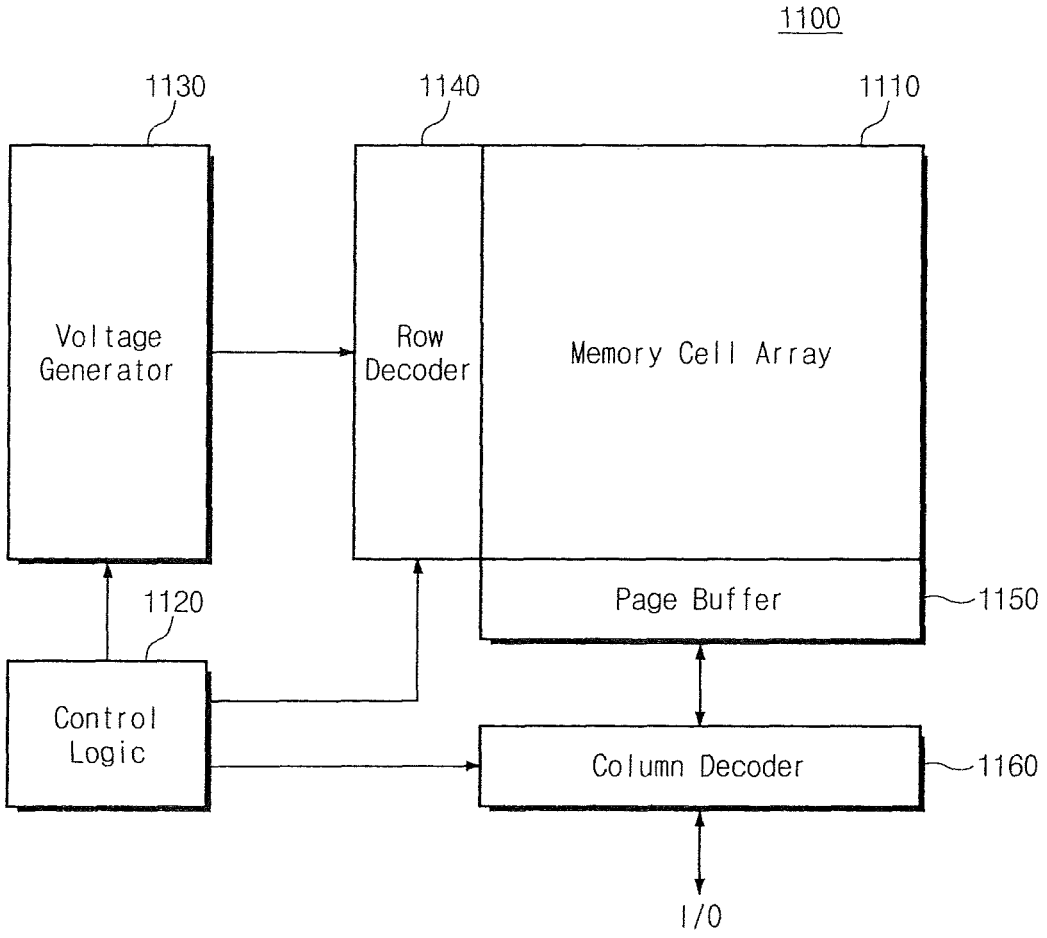

AMENDED
FIG. 2
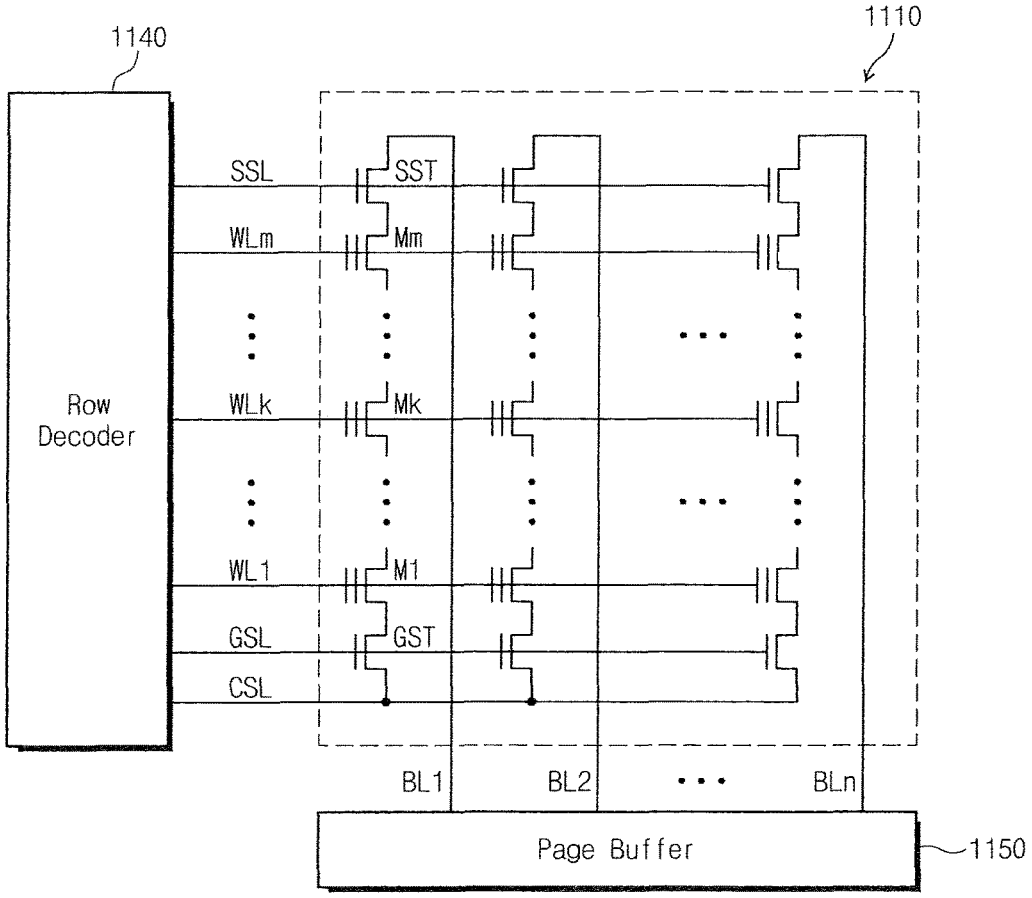

AMENDED
FIG. 3
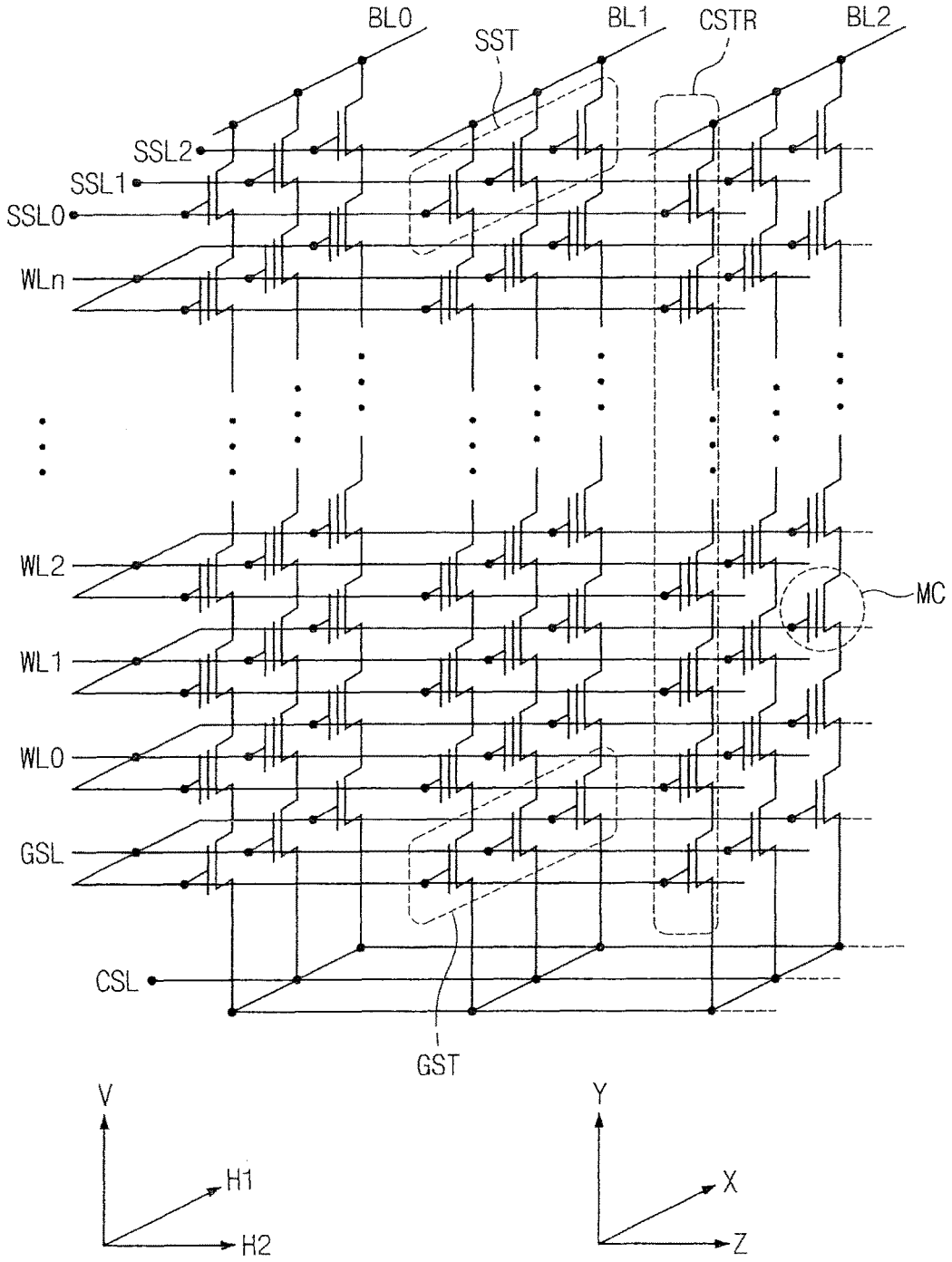

AMENDED
FIG. 4
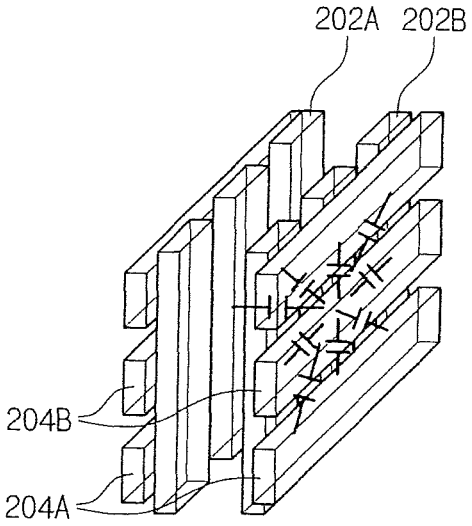

AMENDED
FIG. 5
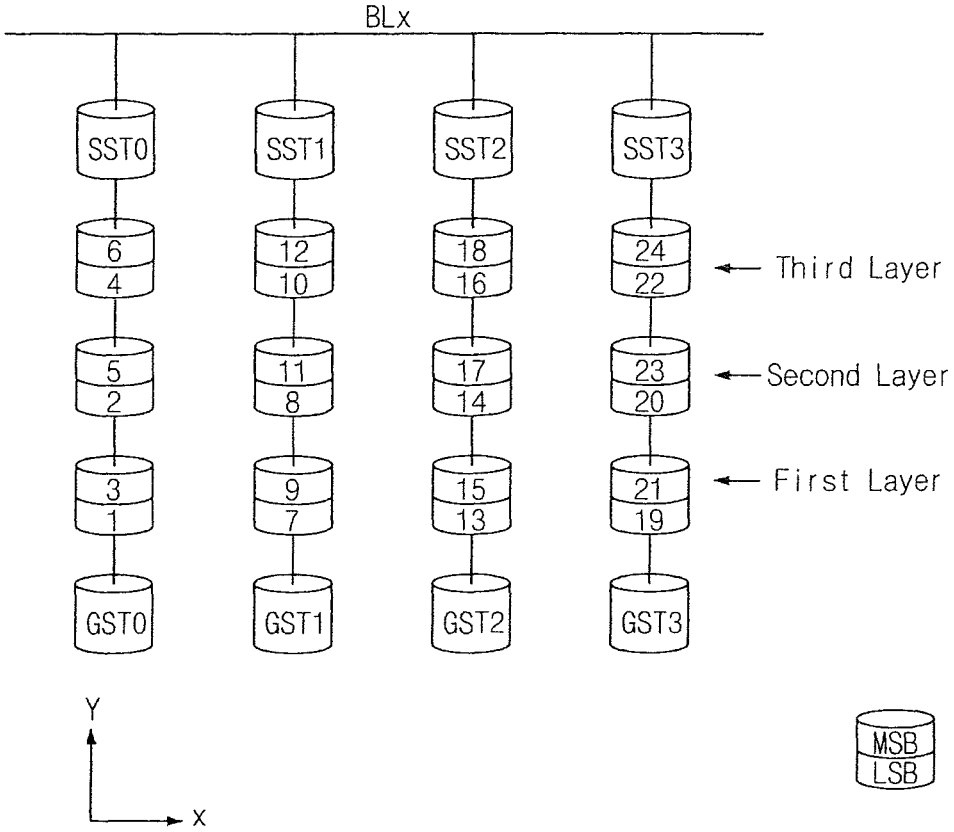

AMENDED
FIG. 6
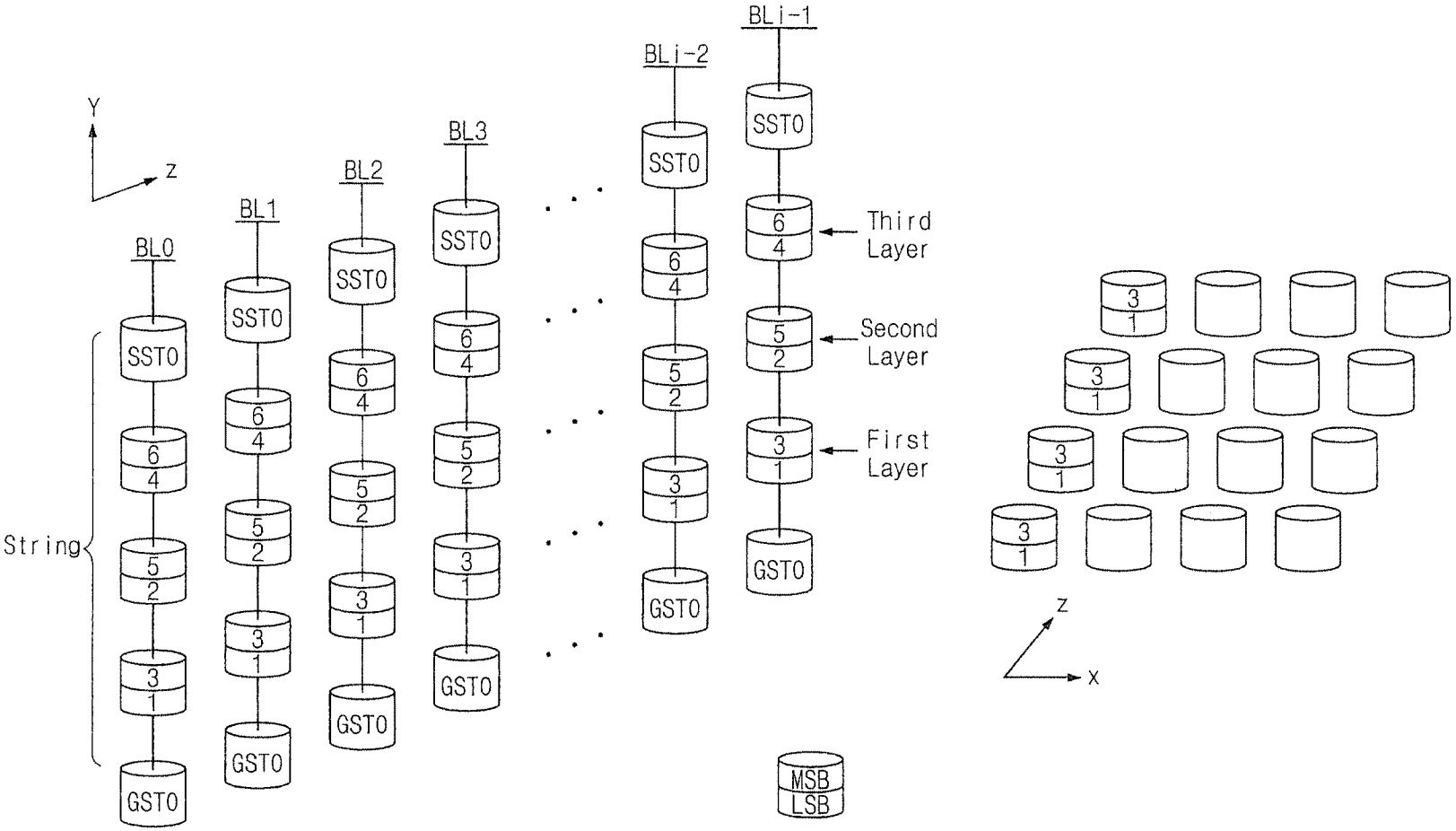

AMENDED
FIG. 7
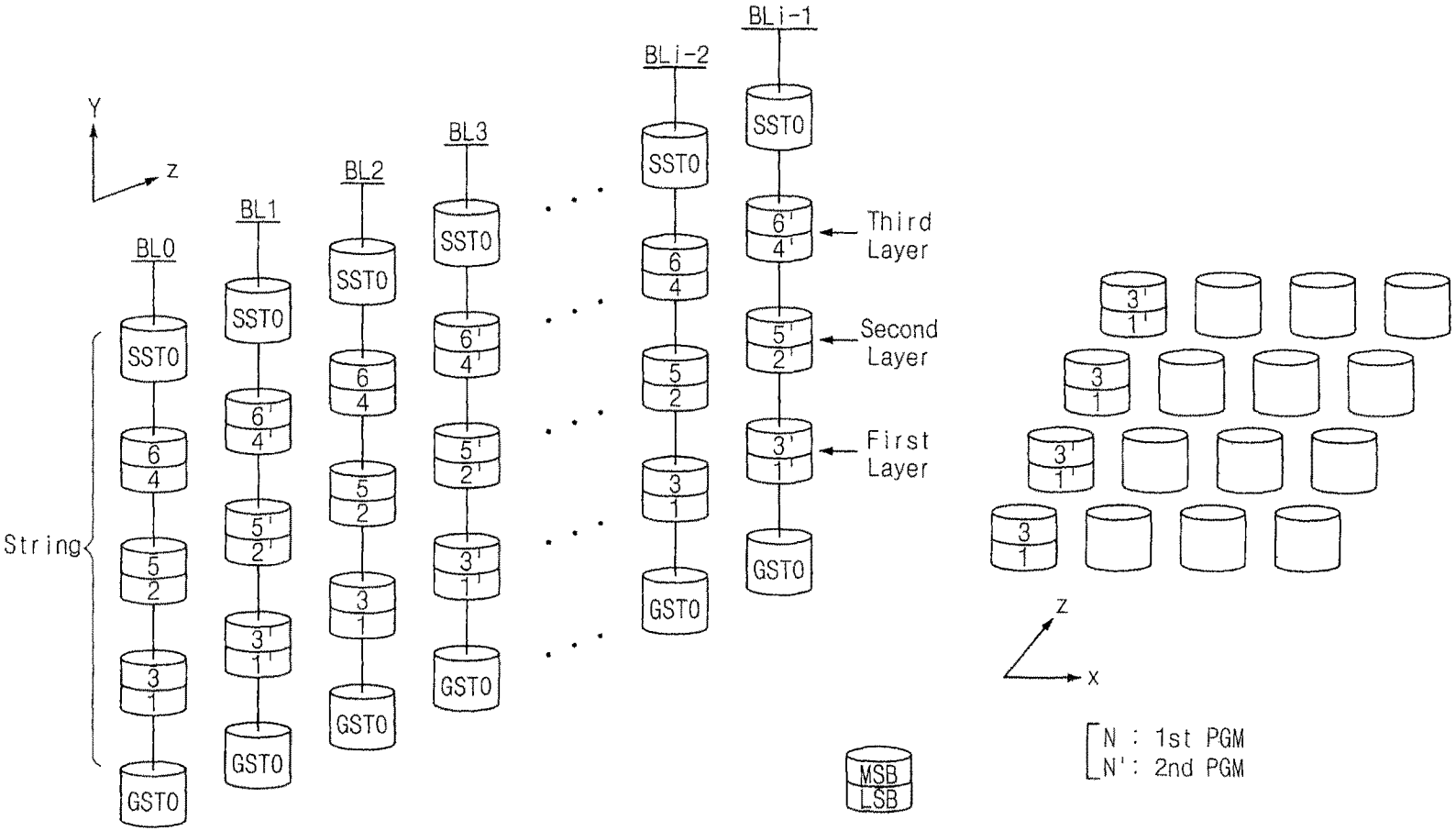

AMENDED
FIG. 8
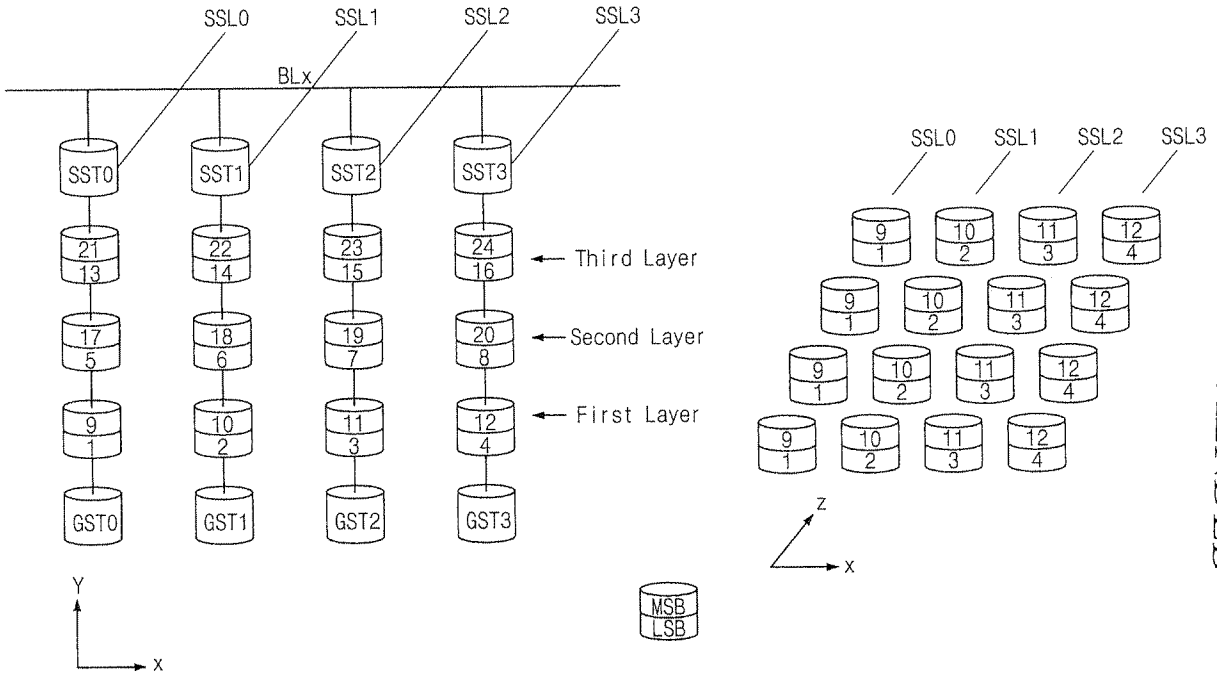

AMENDED
FIG. 9
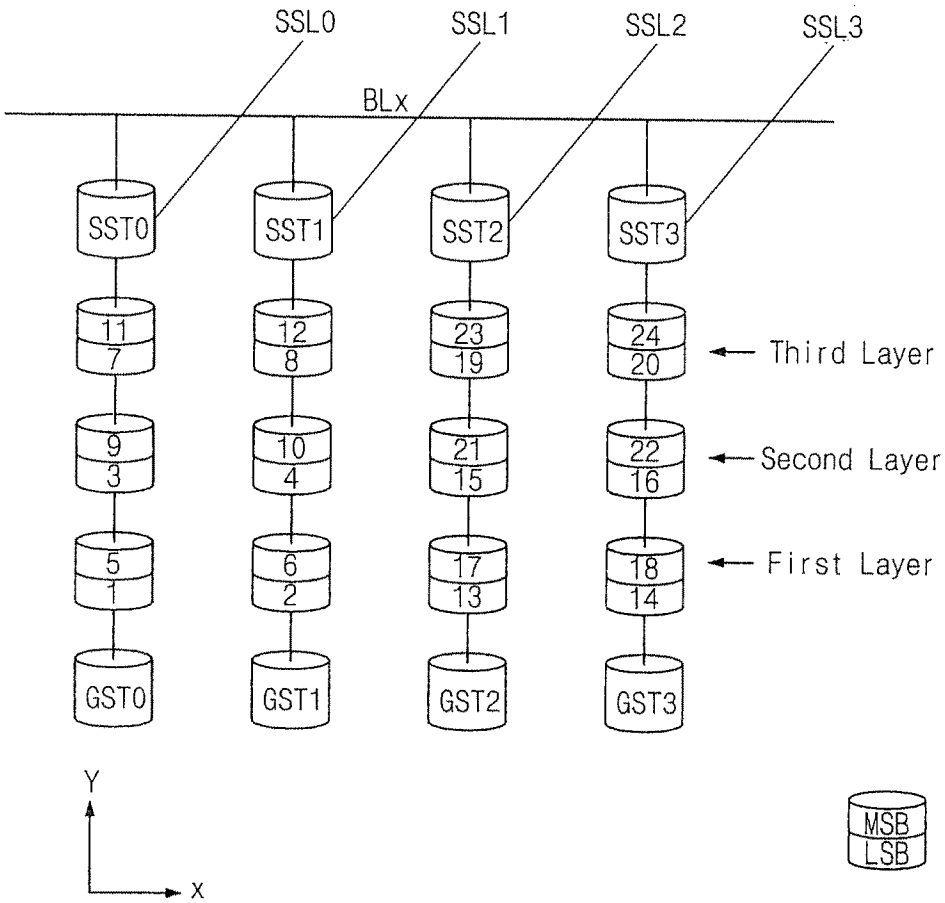
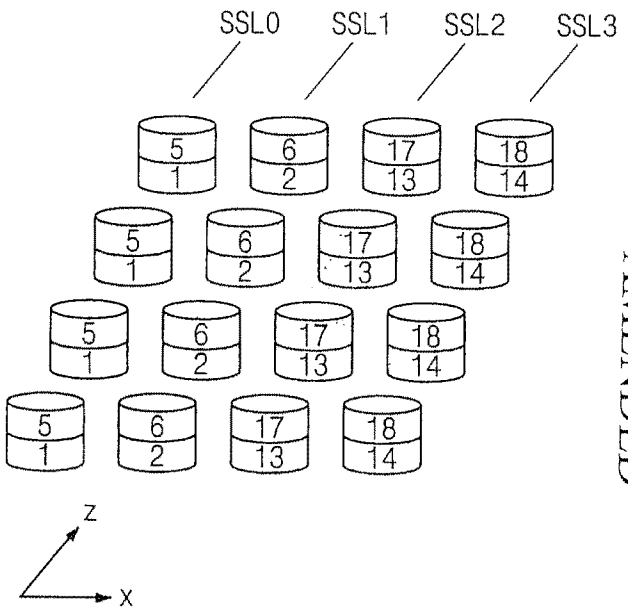

AMENDED
FIG. 10
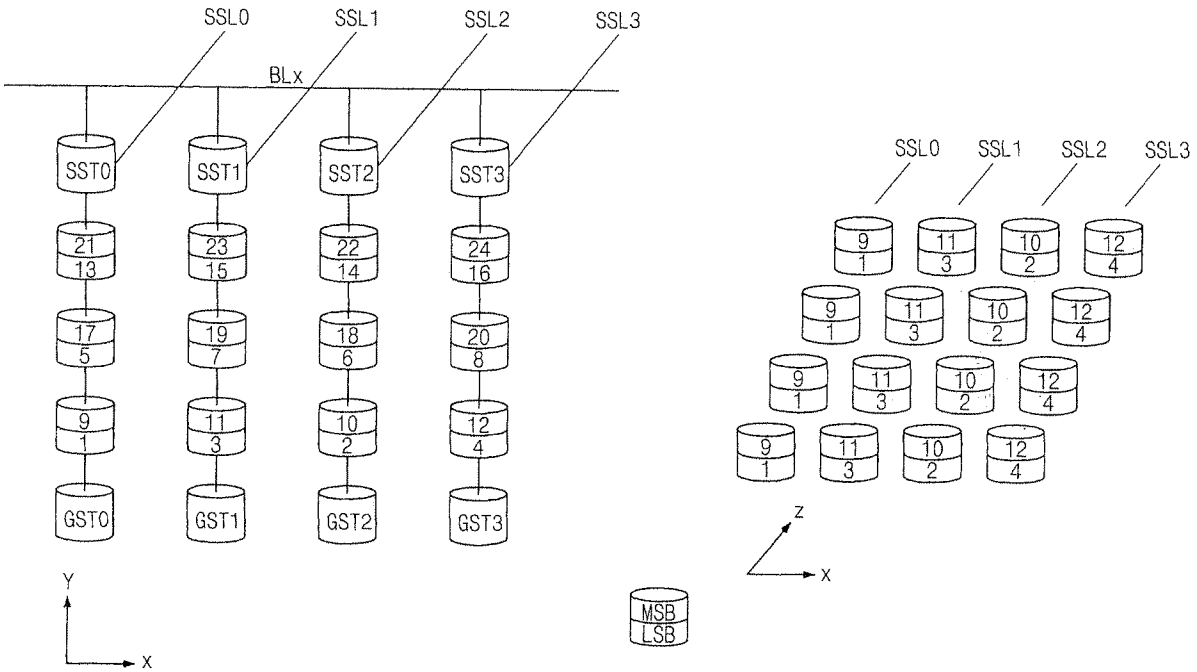

AMENDED
FIG. 11
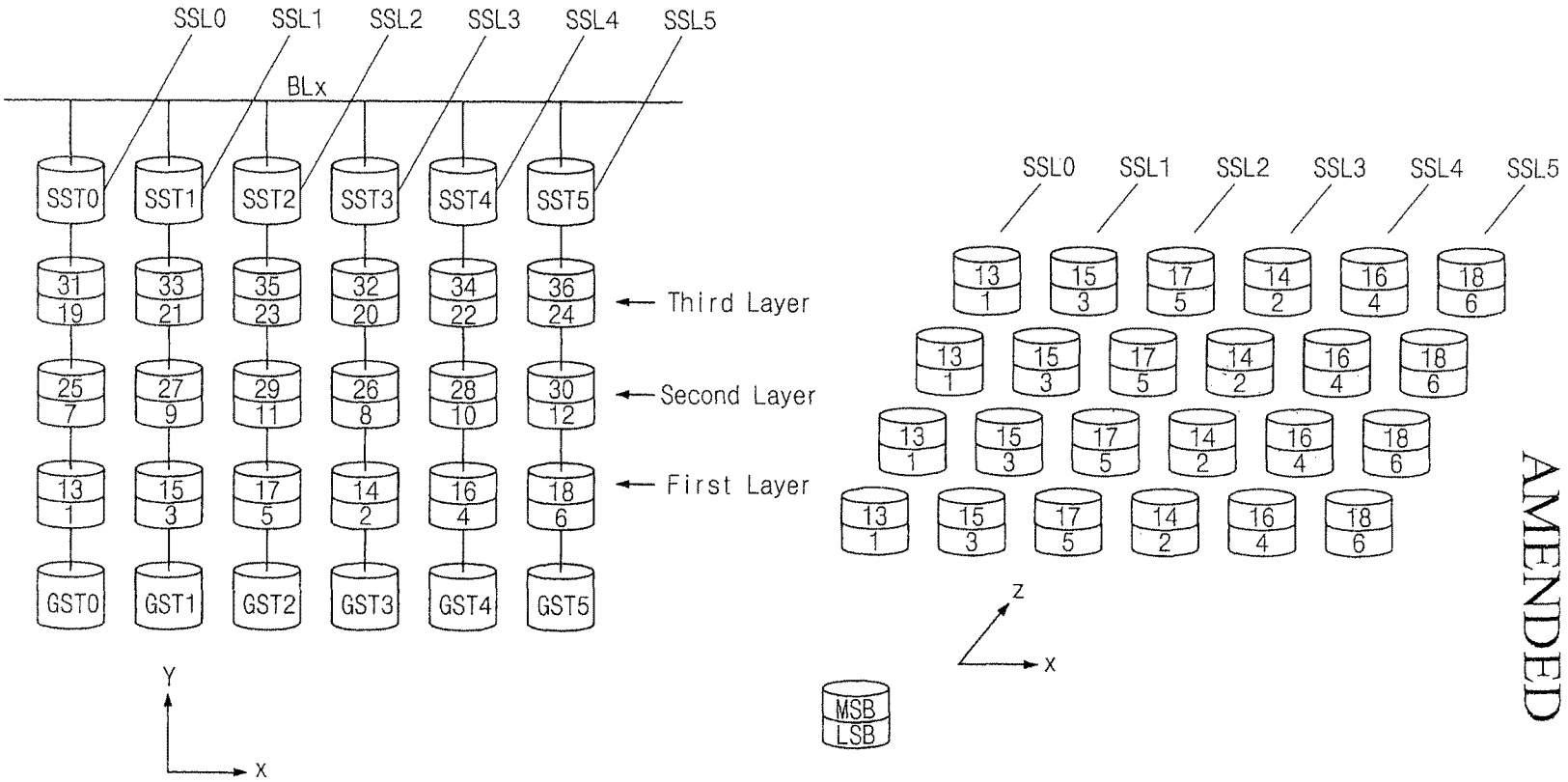

AMENDED
FIG. 12
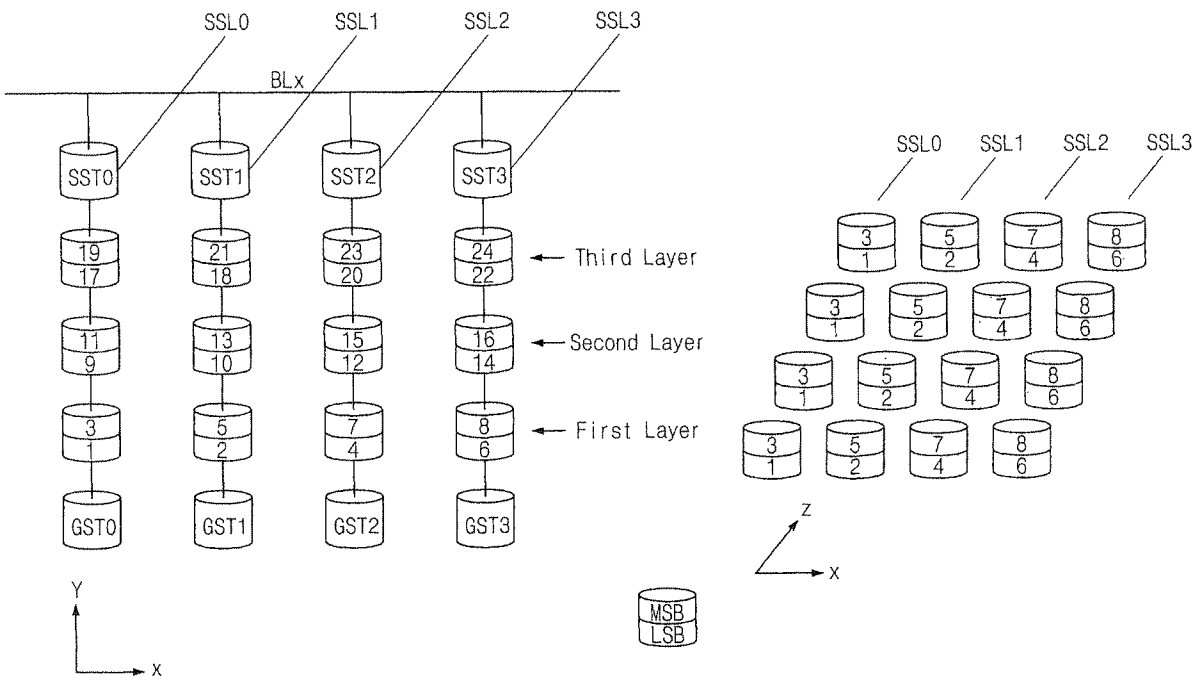

AMENDED
FIG. 13
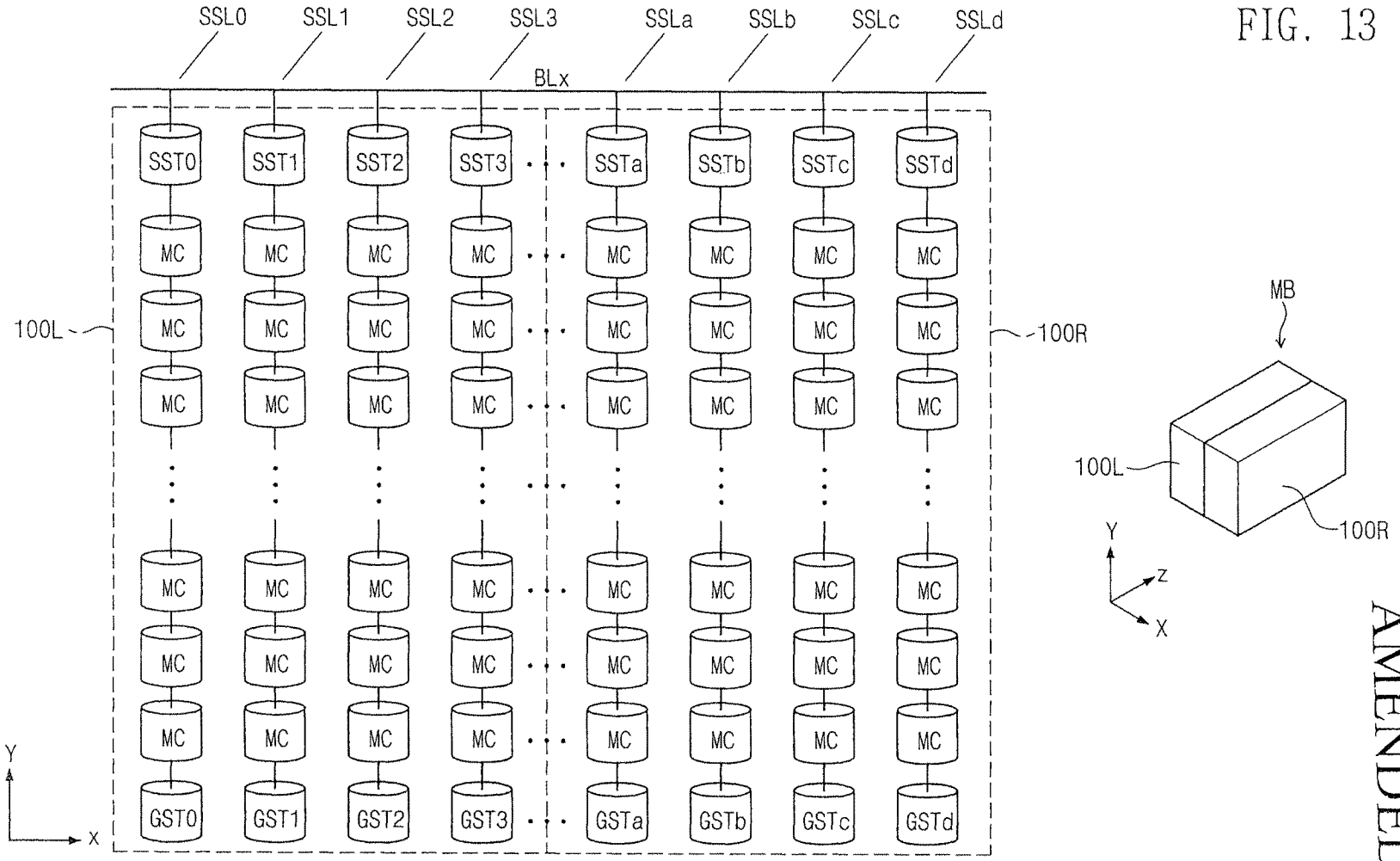

AMENDED
FIG. 14
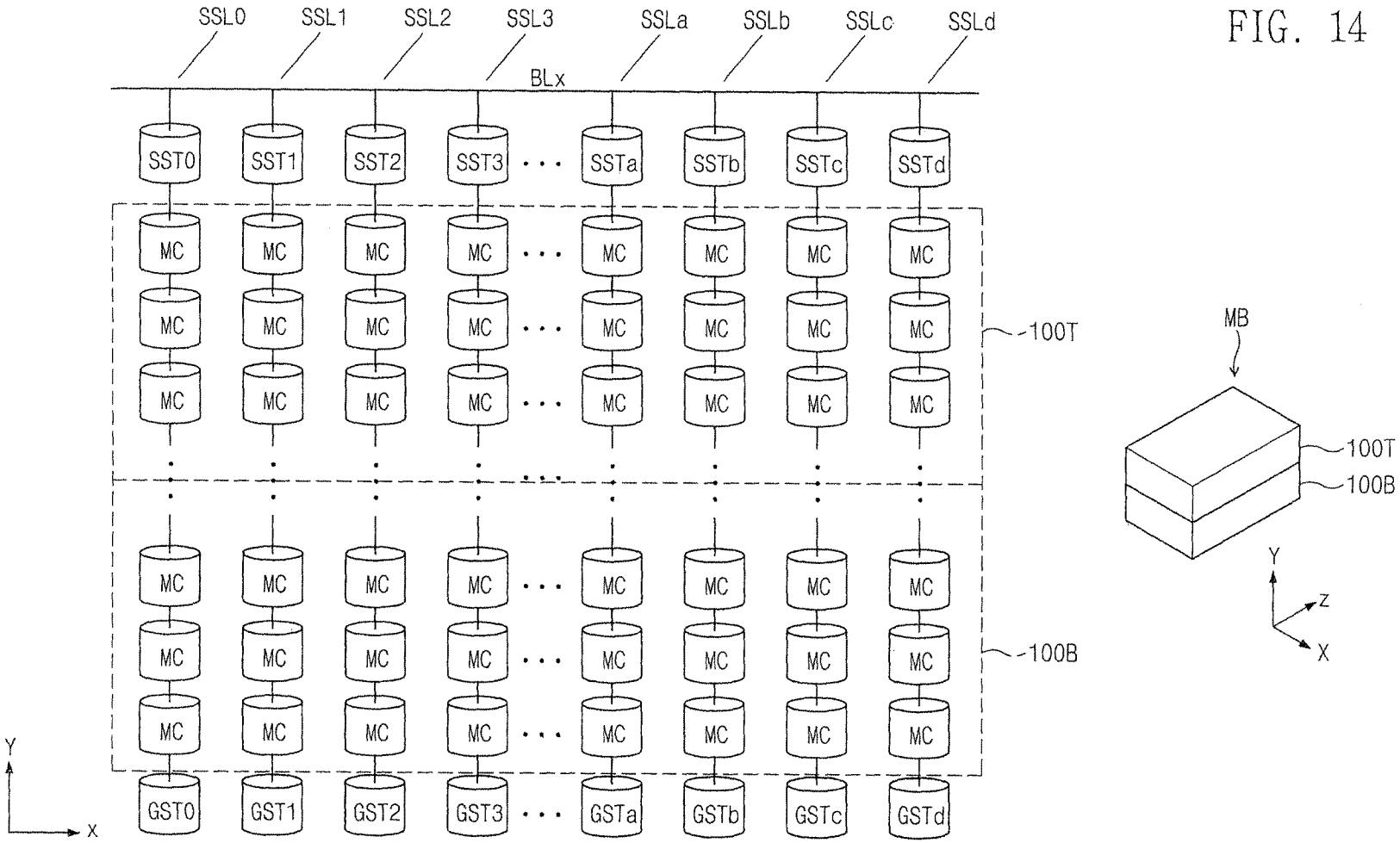

AMENDED
FIG. 15
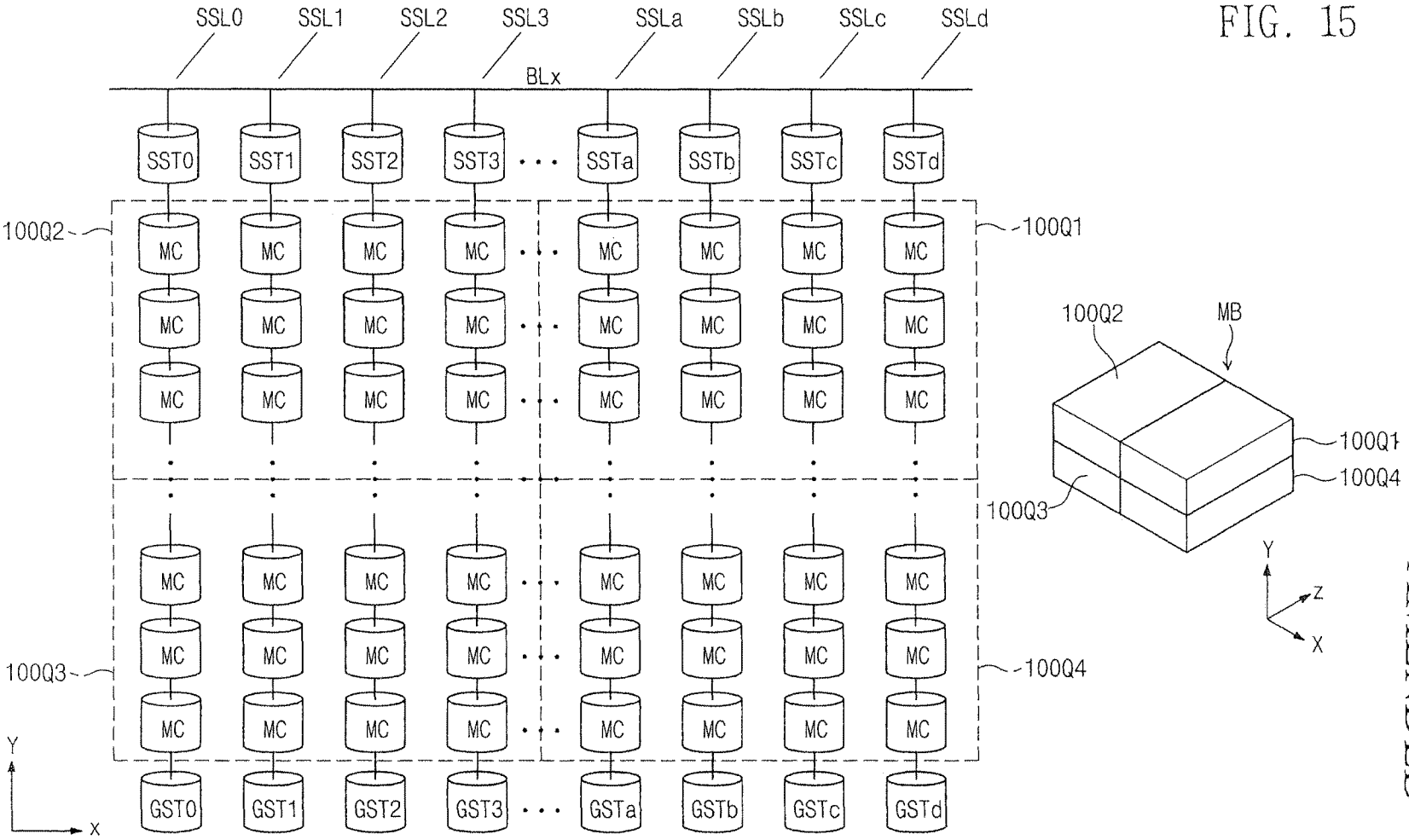

AMENDED
FIG. 16
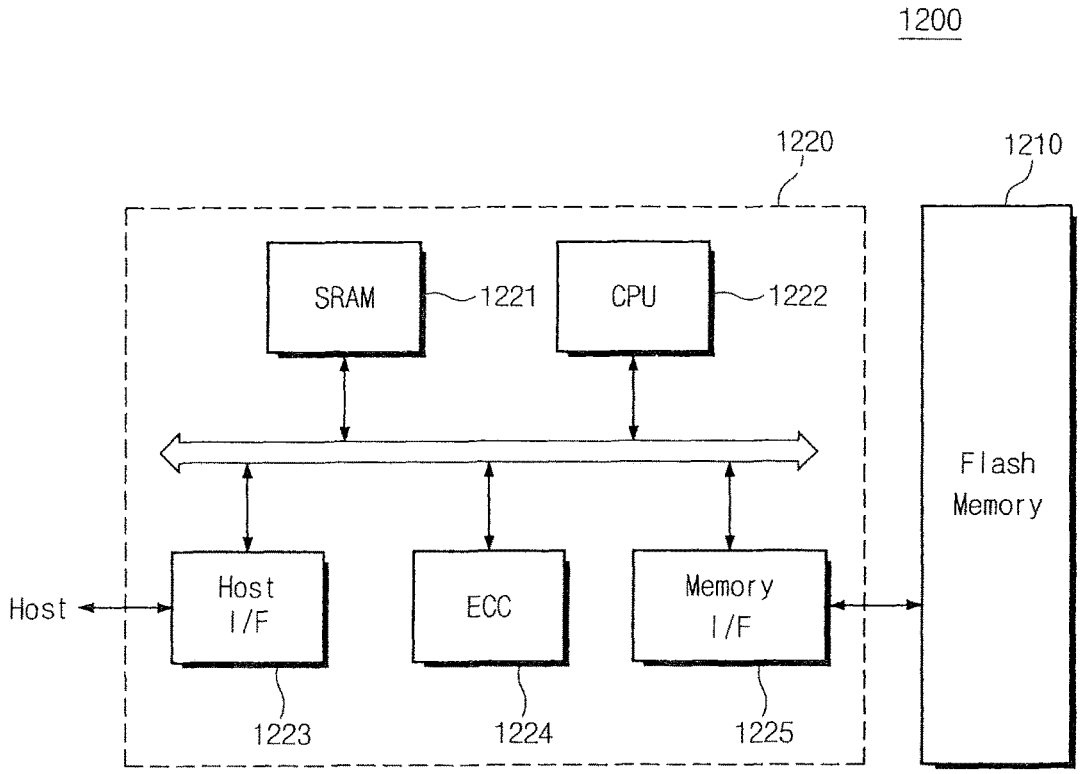

AMENDED
FIG. 17
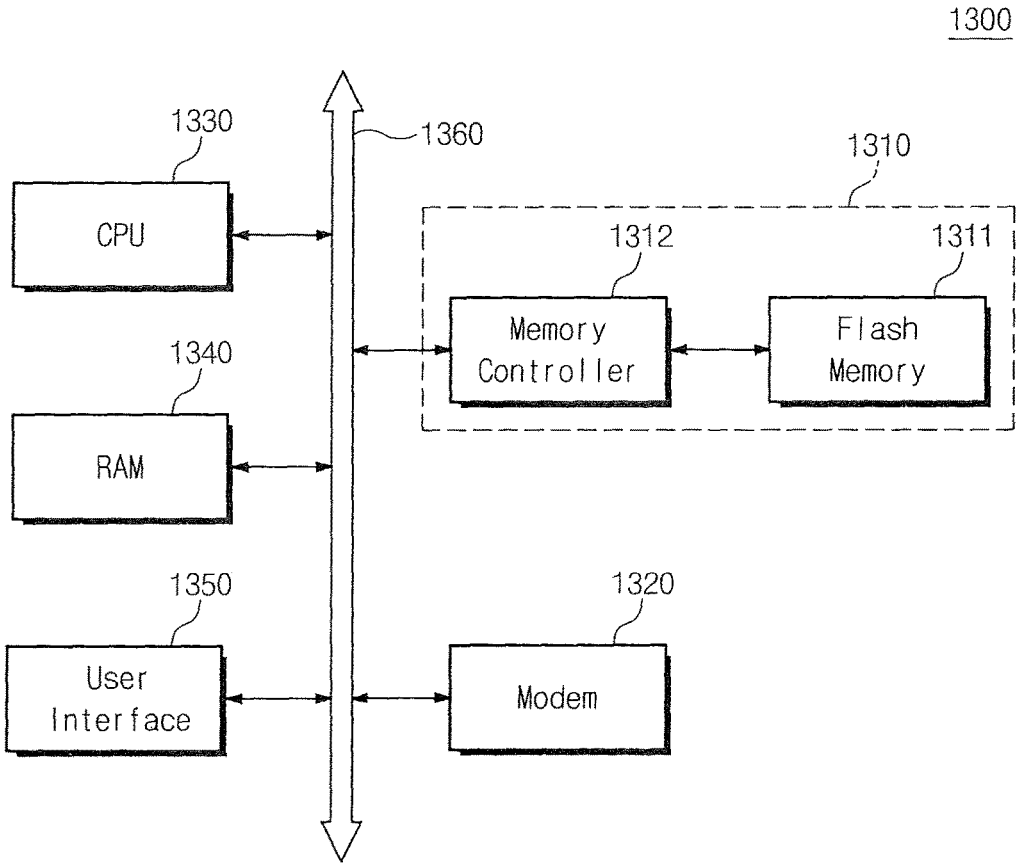

PROGRAMMING METHODS FOR THREE-DIMENSIONAL MEMORY DEVICES HAVING MULTI-BIT PROGRAMMING, AND THREE-DIMENSIONAL MEMORY DEVICES PROGRAMMED THEREBY

Matter enclosed in heavy brackets [ ] appears in the original patent but forms no part of this reissue specification; matter printed in italics indicates the additions made by reissue; a claim printed with strikethrough indicates that the claim was canceled, disclaimed, or held invalid by a prior post-patent action or proceeding.

RELATED APPLICATIONS

This application is a continuation application of U.S. patent application Ser. No. 12/818,285, filed on Jun. 18, 2010, which claims priority under 35 U.S.C. 119 to Korean Patent Application No. 10-2009-0055073, filed on Jun. 19, 2009, the content of which is incorporated herein by reference in its entirety.

BACKGROUND

With the continued emphasis on highly integrated electronic devices, there is an ongoing need for semiconductor memory devices that operate at higher speeds and lower power and have increased device density. To accomplish this, devices with aggressive scaling and multiple-layered devices with transistor cells arranged in horizontal and vertical arrays have been under development.

Non-volatile memory devices, for example flash memory devices, are programmed as single-level cells (SLC), in that each cell stores a single bit of data. In order to increase memory size, research efforts have explored multi-level cell (MLC) programming. In MLC programming, also referred to herein as "multiple-bit", or "multi-bit", cell programming, two or more bits of data are stored in each cell. For example, in the case where two bits of data are stored in a memory cell, least significant bit (LSB) data and most significant bit (MSB) data are stored in each cell. In other words, in a case where a data value '10' is stored in a memory cell, the MSB data is "1" and the LSB data is "0." By adopting multi-bit programming, memory capacity can be increased without increasing memory size.

As devices continue to become reduced in size due to further integration, there is an increased likelihood of inter-cell interference during multi-bit programming, which can lead to erroneous data programming and reduced reliability.

SUMMARY

Embodiments of the present invention are directed to methods of programming memory devices that address and overcome the limitations of the conventional methods. Further, embodiments of the present invention are directed to memory devices programmed according to methods that address and overcome such limitations, as well as systems employing such memory devices. In particular, embodiments of the present invention provide multi-bit programming methods for three-dimensional memory devices, that mitigate or prevent inter-cell interference during programming.

In one aspect, a method of multiple-bit programming of a three-dimensional memory device having arrays of memory cells that extend in horizontal and vertical directions relative to a substrate comprises: first programming a memory cell to be programmed to one among a first set of states; first programming at least one neighboring memory cell that neighbors the memory cell to be programmed to one among the first set of states; and following the first programming of the at least one neighboring memory cell, second programming the memory cell to be programmed to one among a second set of states, wherein the second set of states has a number of states that is greater than the number of states in the first set of states.

In one embodiment, the set of states comprises a set of discrete charge levels that correspond to a set of threshold voltages for the memory cells at a time when the memory cells are sensed during a read operation.

In another embodiment, the at least one neighboring memory cell neighbors the memory cell to be programmed in one of: a first horizontal direction, a second horizontal direction; and the vertical direction.

In another embodiment, the at least one neighboring memory cell neighbors the memory cell to be programmed in a diagonal direction that extends in one of: both the first horizontal and vertical directions; both the second horizontal and vertical directions; and both the first horizontal and second horizontal directions.

In another embodiment, first programming the at least one neighboring memory cell comprises performing first programming a plurality of neighboring memory cells that neighbor the memory cell to be programmed.

In another embodiment, the at least one neighboring memory cell neighbors the memory cell to be programmed in the horizontal direction.

In another embodiment, the at least one neighboring memory cell neighbors the memory cell to be programmed in the vertical direction.

In another embodiment, the at least one neighboring memory cell neighbors the memory cell to be programmed in a diagonal direction.

In another embodiment, the first and second sets of states each comprise a range of defined threshold voltage levels that correspond to a predetermined data value.

In another embodiment, the second set of states is four states, corresponding to two-bit data values and wherein the first programming programs one of the least-significant-bit of the data value and the most-significant bit of the data value and wherein the second programming programs the other of the least-significant-bit of the data value and the most-significant bit of the data value.

In another embodiment, memory cells neighboring each other in the vertical direction are connected in series in a cell string along a vertical channel; cell strings neighboring each other in a first horizontal direction are connected to a common bit line; cell strings neighboring each other in a second horizontal direction are connected to a common string select line; and gates of cells positioned on a same horizontal plane are connected to a common word line.

In another embodiment, the first programming of the memory cell to be programmed is performed on a memory cell of a cell string connected to a first string select line and connected to a first word line; the first programming of the at least one neighboring memory cell that neighbors the memory cell to be programmed is performed on a memory cell of a cell string connected to the first string select line and connected to a second word line that neighbors the first word line, and wherein second programming the memory cell to be programmed to one among a second set of states is performed on the memory cell of the cell string connected to the first string select line and connected to the first word line.

In another embodiment, the multiple-bit programming method proceeds in a minimum-to-maximum word line direction for memory cells connected to each of the string select lines.

In another embodiment, the multiple-bit programming method proceeds in a minimum-to-maximum word line direction for memory cells connected to a first set of the string select lines, and proceeds in a maximum-to-minimum word line direction for memory cells connected to a second set of the string select lines, wherein the first set and second set of string select lines are alternating.

In another embodiment, the first programming of the memory cell to be programmed is performed on a memory cell of a cell string connected to a first string select line; the first programming of the at least one neighboring memory cell that neighbors the memory cell to be programmed is performed on a memory cell of a cell string connected to a second string select line that neighbors the first string select line, and further comprising: first programming a second neighboring memory cell that neighbors the at least one neighboring memory cell to be programmed to one among the first set of states, the second neighboring memory cell connected to a third string select line that neighbors the second string select line opposite the first string select line; and wherein second programming the memory cell to be programmed to one among a second set of states follows the first programming of the second neighboring memory cell.

In another embodiment, the first programming of the memory cell to be programmed is performed on a memory cell of a cell string connected to a first string select line; the first programming of the at least one neighboring memory cell that neighbors the memory cell to be programmed is performed on a memory cell of a cell string connected to a second string select line that neighbors the first string select line, and further comprising: first programming a second neighboring memory cell that neighbors the memory cell to be programmed to one among the first set of states, the second neighboring memory cell connected to the first string select line; and wherein second programming the memory cell to be programmed to one among a second set of states follows the first programming of the second neighboring memory cell.

In another embodiment, the first sets of cell strings comprise memory cells that are activated in response to a first set of word lines and wherein second sets of cell strings comprise memory cells that are activated in response to a second set of word lines, wherein the cell strings of the first sets of cell strings and cell strings of the second sets of cell strings alternate in horizontal position in the second horizontal direction, and wherein the cell to be programmed is associated with a cell string of the first set of cell strings and wherein the at least one neighboring memory cell is associated with a cell string of the second set of cell strings.

In another embodiment, the method further comprises partitioning cell strings connected to the same bit line into first and second blocks and wherein first and second programming of memory cells of the first block are completed prior to first and second programming of memory cells of the second block.

In another embodiment, the method further comprises partitioning memory cells of cell strings connected to neighboring word lines into first and second blocks and wherein first and second programming of memory cells of the first block are completed prior to first and second programming of memory cells of the second block.

In another aspect, a memory system comprises: a memory controller that generates command and address signals; a memory module comprising at least one three-dimensional memory device having arrays of memory cells that extend in horizontal and vertical directions relative to a substrate, the memory module receiving the command and address signals and in response storing and retrieving data to and from the at least one three-dimensional memory device. Each three-dimensional memory device is programmed in a multiple bit programming operation by: first programming a memory cell to be programmed to one among a first set of states; first programming at least one neighboring memory cell that neighbors the memory cell to be programmed to one among the first set of states; and following the first programming of the at least one neighboring memory cell, second programming the memory cell to be programmed to one among a second set of states, wherein the second set of states has a number of states that is greater than the number of states in the first set of states.

BRIEF DESCRIPTION OF THE DRAWINGS

The foregoing and other objects, features and advantages of the embodiments of the invention will be apparent from the more particular description of preferred embodiments of the inventive concept, as illustrated in the accompanying drawings in which like reference characters refer to the same parts throughout the different views. The drawings are not necessarily to scale, emphasis instead being placed upon illustrating the principles of the inventive concept. In the drawings:

FIG. 1, is a block diagram of a memory device in accordance with embodiments of the present invention.

FIG. 2 is a block diagram of the memory cell array of the memory device of FIG. 1, in accordance with embodiments of the inventive concepts.

FIG. 3 is a schematic diagram of a three-dimensional memory cell array in accordance with embodiments of the inventive concepts.

FIG. 4 is a perspective diagram illustrating cell-to-cell coupling for a VNAND-device having a vertical active region that is configured in a bar shape.

FIGS. 5-15 are schematic diagrams illustrating various programming methods for multi-bit programming in three-dimensional memory devices in accordance with embodiments of the inventive concepts.

FIG. 16 is a block diagram of a memory card that comprises a semiconductor device in accordance with the embodiments of the inventive concepts.

FIG. 17 is a block diagram of a memory system that employs a memory module, for example, of the type described herein, in accordance with the embodiments of the inventive concepts.

DETAILED DESCRIPTION OF EMBODIMENTS

Embodiments of the present inventive concept will now be described more fully hereinafter with reference to the accompanying drawings, in which preferred embodiments of the invention are shown. This invention may, however, be embodied in different forms and should not be construed as limited to the embodiments set forth herein. Like numbers refer to like elements throughout the specification.

It will be understood that, although the terms "first", "second", etc. are used herein to describe various elements, these elements should not be limited by these terms. These terms are used to distinguish one element from another. For example, a "first" element could be termed a "second" element, and, similarly, a "second" element could be termed a "first" element, without departing from the scope of the present invention. As used herein, the term "and/or" includes any and all combinations of one or more of the associated listed items.

It will be understood that when an element is referred to as being "on" or "connected" or "coupled" to another element, it can be directly on or connected or coupled to the other element or intervening elements can be present. In contrast, when an element is referred to as being "directly on" or "directly connected" or "directly coupled" to another element, there are no intervening elements present. Other words used to describe the relationship between elements should be interpreted in a like fashion (e.g., "between" versus "directly between," "adjacent" versus "directly adjacent," etc.). When an element is referred to herein as being "over" another element, it can be over or under the other element, and either directly coupled to the other element, or intervening elements may be present, or the elements may be spaced apart by a void or gap.

In regard to a programming method such as, for example, multi-bit programming, the term "upper" is used in the local sense, and not in the geometrical sense. In other words, the term upper may refer to the directional position in which shadow programming is performed. For example, if programming is performed in a direction from word line WLk to word line WL1, then the word line WL1 is an "upper" word line relative to word line WL2. If programming is performed in a direction from word line WL1 to word line WLk, then the WL2 word line is an "upper" word line relative to word line WL1.

The terminology used herein is for the purpose of describing particular embodiments and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

As used herein, the 'Z direction' refers to a direction in which a string selection line (SSL) extends, and is perpendicular to the direction in which a bit line extends, in accordance with embodiments described herein. The 'X direction' refers to a direction in which a bit line extends, and is perpendicular to the direction that a SSL extends, in accordance with embodiments described herein. The 'Y direction' refers to a vertical direction, which is vertical relative to the substrate and is parallel to the direction of extension of the vertical channel or vertical active region in a vertically configured memory device, such as a VNAND device, in accordance with embodiments described herein.

FIG. 1 is a block diagram of a memory device in accordance with embodiments of the present invention. FIG. 2 is a block diagram of the memory cell array of the memory device of FIG. 1, in accordance with embodiments of the present invention.

Referring to FIGS. 1 and 2, a memory device 1100 comprises a memory cell array 1110, control logic 1120, a voltage generator 1130, a row decoder 1140, a page buffer 1150, and a column decoder 1160. The memory cell array 1110 is comprised of a plurality of memory cells which are connected to word lines and bit lines. The memory cells may be arranged in a NAND or NOR memory cell configuration. In the case of a NAND structure, the memory cells are arranged in series to form cell strings. Memory cells connected to the same string share a common bit line.

Control logic 1120 is configured to control overall operation of the memory device. The control logic controls the sequential operations regarding programming, erase and reading actions. For example, control logic 1120 transmits signals to the voltage generator 1130, the row decoder 1140 and the column decoder 1160 in accordance with the operation to be performed, for example, erase, programming, and read operations.

The voltage generator 1130, controlled by the control logic 1120, generates voltages to be applied to components of the memory device such as selected word lines, unselected word lines, string select lines SSL, ground select lines GSL, and common source lines CSL. The voltage 1130 generator also generates the various voltage levels such as the Vpass, Vread, Verase, and Vstep voltages required for performing the device operations.

The row decoder 1140, controlled by the control logic 1120, drives the word lines WLk, string select lines SSL, ground select lines GSL, and common source lines CSL, in response to the row address. For example, in a programming operation, the row decoder applies a programming voltage Vpgm to a selected word line and a pass voltage Vpass to an unselected word line.

The page buffer 1150 operates as a sense amplifier and/or a write driver. In a reading operation, the page buffer reads data from a memory cell array 1110. The page buffer detects a bit line voltage, and latches the data to be detected. In a programming operation, depending on data I/O that is input through a column decoder 1160, the page buffer 1150 drives a power voltage Vcc or a ground voltage 0V to the corresponding bit lines.

The column decoder 1160 reads latched data from the page buffer 1150, or delivers data to the page buffer in response to a column address. In other words, the column decoder 1160 determines which signals of the bit lines BLn of the device read by the page buffer 1150 are to be used in determining data values that are read, or determines voltages that are applied to the bit lines BLn during programming and erase operations.

FIG. 2 is a block diagram of the memory cell array 1110 of the memory device 1100 of FIG. 1, in accordance with embodiments of the present invention. In FIG. 2, it can be seen that the row decoder 1140 applies the various voltage levels to the one of or more string select lines SSL, the word lines WLk, the ground select line GSL, and the common source line CSL. The page buffer 1150 is connected to the bit lines BLn of the device 1110.

Referring to FIG. 2, a memory cell array 1110 comprises a plurality of word lines WL1 . . . WLk, a plurality of bit lines BL1 . . . BLn, and a plurality of memory cells M1 . . . $M_{m,n}$. Word lines of the memory cell array are connected to a row decoder 1140. The row decoder 1140 is connected to the SSL, the word lines, the GSL and the CSL. Bit lines BLn of the memory cell array are connected to page buffers 1150. Cells can be arranged in two dimensions and recently, vertical NAND channel configurations have been investigated to increase the density of non-volatile memory devices as one type of three-dimensional memory device. One such vertical NAND channel structure is discussed in "Bit Cost Scalable Technology (BICS) With Punch and Plug Process For Ultra High Density Flash Memory," by H. Tanaka et al. in Symp. On VLSI Tech. Dig., pp14~15(2007). Meanwhile, US Patent Publication No. 2009-0121271 entitled 'Vertical-type Non-Volatile Memory Devices' discloses a vertical NAND having a metal gate and a method of forming the same. The disclosures of the above article and US publication are incorporated herein by reference in their entirety. A detailed explanation of BICS devices is available in United States Patent Application Publication No. 2007/0252201 entitled "Nonvolatile Semiconductor Memory Device and Manufacturing Method Thereof," which is also herein incorporated by reference.

Non-volatile memory devices, for example flash memory devices, can be programmed as single-level cells (SLC), in that each cell stores a single bit of data. In order to increase memory size, research efforts have explored multi-bit cell (MLC) programming. In MLC programming, two or more bits of data are stored in each cell. For example, in the case where two bits of data are stored in a memory cell, least significant bit (LSB) data and most significant bit (MSB) data are stored in each cell. In other words, in a case where a data value '10' is stored in a memory cell, the MSB data is "1" and the LSB data is "0." By adopting multi-bit programming, memory capacity can be increased without increasing memory size. While embodiments described herein illustrate the programming of two bits of data in three-dimensional multi-bit cell memory devices, multi-bit programming of more than two bits of data in each cell can be applied to the present inventive concepts.

In this regard, if the sequence of the programming operation is such that after MSB data is programmed in a given memory cell, LSB data is then programmed in a memory cell neighboring, or spatially next to, the given memory cell, the data previously programmed in the memory cell can be inadvertently changed by cell disturbance due to cell-to-cell coupling of adjacent cells. For example, if LSB data are programmed in memory cells associated with WL2 after both LSB and MSB are programmed in memory cells associated with WL1, the LSB or MSB data programmed in memory cells associated with WL1 may be inadvertently changed due to cell disturbance. In the programming of a 3D device, there is another disturbance that can occur in a horizontal direction between cells of the same plane and also in a vertical direction between cells of different levels of neighboring cell planes. Disturbance can also occur for cells neighboring each other in a horizontal diagonal direction, a vertical diagonal direction and a both-horizontal-and-vertical direction. This disturbance becomes more serious as devices are more aggressively scaled down and as the number of adjacent cells increases.

Meanwhile, another limitation of a three dimensional device arises due to different speed of programming that is present between multi-bit programming of LSB data and MSB data. In general, LSB programming speed is faster than that of MSB programming speed. Thus, as the number of cell arrays increases, the programming speed among cells of the same plane in a block may be non-uniform and thus can become noticeable to a user.

In order to prevent this unwanted phenomenon caused by the cell disturbance, a pattern of ordering programming can be adopted. In an alternative approach, the programming of MSB data can follow the programming of LSB data of an adjacent cell.

In one example, the first programming operation, for example, the LSB programming operation, places the cell in one among a first set of states, for example programs the cell to have a threshold voltage corresponding to a '11' state or a 'X0' state. In a second programming operation, for example, the MSB programming operation, the cell is placed in one among a second set of states, for example, in a threshold voltage corresponding to a '11' state, a '01' state, a '10' state, or a '00' state. In this manner, the second set of states has a number of states that is greater than the number of states in the first set of states.

For programming a multi-bit memory cell of a three dimensional device, cell-to-cell coupling, or cell-to-cell interference can often occur when there is a large change, or 'span', in the threshold voltage Vth of a cell, for example, due to a programming operation from the '00' state (−3V) to the '11' state (+4V), resulting in a total change in threshold voltage of 7V. As a result, neighboring cells can likewise be subject to a large shift in threshold voltage. This includes memory cells that neighbor the memory cell to be programmed within the same memory cell string, as well as memory cells that share the same word line as the memory cell to be programmed. This undesirable phenomenon is more significant with the industry trend toward further integration of memory devices. The lower span of voltage change during programming of LSB from an erase state to an LSB programmed state may reduce or remove unwanted data change. Thus, the LSB programming operation of an adjacent memory cell would not adversely affect the programmed memory cell. In this regard, the span of voltage change refers to the magnitude of voltage change from the initial state to the resultant state. It should be noted that even though the multiple-programmed cell in the embodiments described herein is a two-bit multiple-cell, embodiments of the present invention are not restricted to two-bit multi-cell programming; but rather can be adopted to n-bit multi-cell programming in accordance with the technical concept of the present invention. Also, the programming operations according to the present embodiments can be according to various patterns, for example in a horizontal pattern, in a vertical pattern, or in a block pattern.

Multi-bit cell programming in accordance with the present embodiments alleviates this problem by programming a cell in more than one step to ensure that there is no direct transition between the state having the lowest threshold voltage and the state having the highest threshold voltage. In the example given above, the multi-bit programming of the present invention ensures that no cells transition between the '00' and '11' state, thereby limiting the amount of Vth transition during a given programming operation.

The multi-bit programming operation in accordance with the present embodiments accomplishes its objective in two ways. First, the multi-bit programming operation of the present invention performs programming on one bit of the data at a time. For example, the least significant bit (LSB) is first programmed in an initial programming operation, followed by programming of the most significant bit (MSB) in a subsequent programming operation. Second, the multi-bit programming operation of the present invention avoids programming of neighboring memory cells of the same cell string during consecutive programming operations.

It should be noted that the multi-bit programming operation of the present invention, for example for a three dimensional memory configuration, may be conducted according to various patterns or sequences, which will be described in connection with the following drawings in the specification. It should be also noted that for a three dimensional device, all bit lines can be shared by the same page buffer, and memory cells associated with bit lines connected to a common SSL can be programmed at the same time for fast operation. Alternatively, neighboring bit lines BLi, and BLi+1 can be shared by the same page buffer and memory cells associated with even bit lines BLi can be programmed at a different time from those associated with odd bit lines BLi+1 for prohibiting crosstalk between neighboring bit lines.

FIG. 3 is a schematic diagram of a three-dimensional memory cell array in accordance with embodiments of the present application. Programming methods according to embodiments of the present application can be applied to three-dimensional memory devices such as BICS and TCAT devices. As described above, BICS and TCAT devices comprise vertical memory cell strings wherein the memory cells connected to the string are arranged along a vertical channel.

Referring to FIG. 3, in this example, a three-dimensional memory device is configured as a vertical-NAND device that includes a cell array, comprising a plurality of memory strings, which contain vertical active regions, which can be referred to as vertical channels, that extend in a vertical direction. Memory cell transistors formed along a common vertical active region are arranged in series to form a cell string CSTR. An upper-most transistor of a cell string CSTR is referred to as an upper select transistor or a string selection transistor SST and a lower-most select transistor of a cell string is referred to as a lower select transistor or a ground select transistor GST. Memory cell transistors MC are arranged between the upper select transistor SST and the lower select transistor GST of a cell string CSTR.

In this regard, the memory cell array can be divided into a plurality of blocks. The definition of a block herein may be a unit for erase operation. However a block may be a set of cells physically or logically grouped. For example, a set of cells that share a common word line may be defined as a block. Alternatively, a set of cells that share common source line (CSL) may be defined as a block. The block may be further partitioned into a plurality of sub-blocks, each comprising a unit for purposes of programming operations.

The tops of the vertical active regions arranged in a first horizontal direction H1 (along x direction) are connected to each other along bit lines BLn. The bottoms of the vertical active regions are connected to each other along a common source line CSL. Gates of the upper select transistors SST arranged in a second horizontal direction H2 (along z direction) are connected to each other along string select lines SSLn. Gates of the lower select transistors GST may or may not be connected to each other to provide a lower select line or ground select line GSL. Gates of the memory cell transistors MC sharing a common vertical row are connected to each other to provide word lines WL0, WL1 . . . WLn. Word lines WLn of different rows are independent from each other.

Multi-bit programming can be applied to three-dimensional memory devices, such as the vertical-NAND BICS and TCAT devices. However, such multi-bit programming introduces additional complexities that are not presented in planar devices. For example, in a two-dimensional planar device, cell coupling is a problem only in the planar direction of the word line; however, in a three-dimensional device, cell coupling can also occur in the direction of extension of the string select line SSL. Also, in a three-dimensional device, an additional cell coupling can occur between cells of the same vertical plane, and between cells that lie along adjacent vertical planes. Cell coupling can also occur in the diagonal direction between cells of the same vertical plane, and between cells that lie along adjacent vertical planes. The relative seriousness of the coupling increases with increased device integration. Further, for a three-dimensional device where the shape of vertical active region is generally in that of a vertically oriented column or bar, the cell coupling of neighboring active regions that oppose and face each other can be large. The amount of cell coupling between adjacent cells can be alleviated by adjusting the programming order or programming sequence of memory cells of the device.

Further, the difference of programming speed for MSB and LSB may have a poor influence on device performance. The programming speed of LSB data can be higher than the programming speed of MSB data for a given cell. Thus, as the number of cell arrays increases, the programming speeds among cells of the same plane within a block may be non-uniform so that a user can perceive a difference in speed. Certain embodiments of the present inventive concept employ multi-bit programming in a manner that takes advantage of MSB and LSB programming in turn. Thus, the programming speed may be managed by the multi-bit programming of the present invention in a manner that resolves or alleviates this discrepancy.

Embodiments of the present inventive concept address and alleviate the problems of cell disturbance in the vertical, horizontal or diagonal directions, and mitigate the problems associated with variance in programming speed.

FIG. 5 is a schematic diagram illustrating a programming method for multi-bit cell programming in a three-dimensional memory device. A programming order is illustrated that limits cell disturbance.

In the embodiment of FIG. 5, the sequence of programming memory cells is conducted in an upward direction from memory cells of lower position closer to the ground select transistor GST to memory cells of higher position closer to the string select transistor SST. Memory cells sharing the same string select line of a first layer are first programmed, followed by memory cells sharing the next higher string select line of second layer, followed by memory cells sharing the next higher string select line of third layer, and so forth.

Initially, the memory cells of a first layer are programmed. First, as indicated by program number '1', the LSB of the data to be programmed in memory cells of the first layer are programmed. Next, as indicated by program number '2', the LSB of the data to be programmed in memory cells of a second layer is programmed instead of direct programming of the MSB of memory cells of the first layer. Next, as indicated by program number '3', the MSB of the data to be programmed in memory cell of the first layer is programmed. Next, as indicated by program number '4', the LSB of the data to be programmed in memory cell of a third layer is programmed. Next, as indicated by program number '5', the MSB of the data to be programmed in memory cell of the second layer is programmed. Next, as indicated by program number '6', the LSB of the data to be programmed in memory cell of the third layer is programmed. When the programming of a plurality of cell strings connected to a first string select line SSL0 is finished, the programming of a plurality of strings connected to a second string select line SSL1 commences. Next, as indicated by program number '7', the LSB of the data to be programmed in memory cells of the first layer are programmed. Next, as indicated by program number '8', the LSB of the data to be programmed in memory cells of a second layer is programmed instead of direct programming of the MSB of memory cells of the first layer. Next, as indicated by program number '9', the MSB of the data to be programmed in memory cell of the first layer is programmed. Next, as indicated by program number '10', the LSB of the data to be programmed in memory cell of a third layer is programmed. Next, as indicated by program number '11', the MSB of the data to be programmed in memory cell of the second layer is programmed. Next, as indicated by program number '12', the LSB of the data to be programmed in memory cell of the third layer is programmed. As such, multi-bit programming is performed in an upward vertical direction of the y-axis. In an alternative embodiment, the sequence of programming memory cells can be conducted in an downward vertical direction from memory cells of a higher position closer to the string selection transistor SST to memory cells of lower position closer to the ground select transistor GST. The upward direction is herein defined as 'minimum-to-maximum word line direction' and the downward direction is defined as 'maximum-to-minimum word line direction.' . In certain embodiments, the memory cells associated with a first cell string can be programmed in a 'minimum-to-maximum' direction, and the memory cells associated with a second cell string, for example, a second cell string that neighbors the first cell string, can be programmed in a 'maximum-to-minimum' direction.

In this regard, referring to FIG. 6 when viewed along the z-direction in which the string select line SSL extends and in a direction perpendicular to the bit lines BLi, all bit lines can be selected at the same time. Alternatively, one group of bit lines that are connected to a common string select line SSL, for example, bit lines of even number may be selected and programmed at a time and the other group of bit lines that are connected to the common SSL, for example bit lines of odd number can be separately selected and sequentially programmed as described below in connection with FIG. 7.

Referring to FIG. 7, in other words, in the z-direction in which the string select line SSL extends, memory cells of the same layer may be grouped in at least two groups. In this arrangement, a first group of memory cells are first programmed, for example, the cells connected to the even bit lines BL0, BL2, BLi−2, and then one or more other groups of cells, for example, the cells connected to the odd bit lines BL1, BL3, BLi−1 are subsequently programmed. During the time when a group of memory cells is programmed, memory cells of the other groups of cells can be program-inhibited. This manner of programming can be effective for device configurations where cell coupling between adjacent strings is significant in the z-direction in which the SSL extends.

According to the embodiment of FIGS. 6 and 7, and other embodiments described herein, a multi-bit programming operation is performed in a manner that ensures that MSB programming of a first cell does not occur prior to LSB programming of a second cell that neighbors the first cell in the word-line direction, or, in other words, in the vertical or y-axis direction. This programming method mitigates or eliminates cell coupling that can otherwise occur between cells that neighbor each other in the vertical direction.

FIG. 8 is a schematic diagram illustrating another programming method for multi-bit programming in a three-dimensional memory device.

In the embodiment of FIG. 8, a memory cell associated with the first string select line $SSL_{j-1}$ (SSL0 in this figure) is first programmed, followed by a memory cell associated with the neighboring string select line $SSL_j$ (SSL1, in this figure), followed by a memory cell associated with the next neighboring string select line $SSL_{j+1}$ (SSL2, in this figure), and so forth. While this embodiment illustrates a programming progression in a direction from a lower string select line SSL to a neighboring upper string select line $SSL_{j+1}$, the progression can also, in other embodiments, occur in a direction from an upper string select line $SSL_{j+1}$ to a neighboring lower string select line $SSL_j$. In the present embodiment, interference due to coupling between memory cells is mitigated not only in the word line direction, or vertical direction (along the z direction), but also in the string select line SSL direction, or in the first horizontal direction H1 of extension of the bit lines (along x direction). A detailed progression of this programming operation will now be provided.

Initially, the memory cells constituting the first cell string coupled to, or associated with, the string select line $SSL_0$ are selected for programming by enabling the string select line $SSL_0$. The LSB of the data to be programmed in the memory cell connected to SSL0 and in the first layer is programmed, as indicated by program number '1'.

Next, the memory cells constituting the second cell string that are associated with the string select line $SSL_1$ are selected for programming by enabling the string select line $SSL_1$. The LSB of the data to be programmed in the memory cell connected to SSL1 and in the first layer is programmed, as indicated by program number '2'.

Next, the memory cells constituting the third cell string that are associated with the string select line $SSL_2$ are selected for programming by enabling the string select line $SSL_2$. The LSB of the data to be programmed in the memory cell connected to SSL2 and in the first layer is programmed, as indicated by program number '3'.

Next, the memory cells constituting the fourth cell string that are coupled to the string select line $SSL_3$ are selected for programming by enabling the string select line $SSL_3$. The LSB of the data to be programmed in the memory cell connected to SSL3 and in the first layer is programmed, as indicated by program number '4'.

After programming the LSB data of memory cells connected to a first layer and before programming the MSB data of the cells comprising the first layer, the memory cells constituting the first cell string connected to the string select line $SSL_0$ are selected for programming by enabling the string select line $SSL_0$. The LSB of the data to be programmed in the memory cell associated with SSL0 and in a second layer is programmed, as indicated by program number '5'.

Next, the memory cells constituting the second cell string connected to the string select line $SSL_1$ are selected for programming by enabling the string select line $SSL_1$. The LSB of the data to be programmed in the memory cell associated with SSL1 and in the second layer is programmed, as indicated by program number '6'.

Programming of LSB data for memory cells of the second layer proceeds in the manner described above, as indicated by program numbers '7' and '8'. Following this, programming of MSB data of the memory cells of the first layer is performed in the manner described above, as indicated by program numbers '9', '10', '11', and '12'. Following this, programming of LSB data of the memory cells of the third layer is performed in the manner described above, as indicated by program numbers '13', '14', '15', and '16' Following this, programming of MSB data of the memory cells of the second layer is performed in the manner described above, as indicated by program numbers '17', '18', '19', and '20'. Programming of memory cells continues in this manner.

According to the embodiment of FIG. 8, a multi-bit cell programming operation is performed in a manner that ensures that MSB programming of a first cell does not occur prior to LSB programming of a second cell that neighbors the first cell in the word-line direction, or in the vertical direction. Also, the multi-bit programming operation of FIG. 8 is further performed in a manner that ensures that MSB programming of a first cell does not occur prior to LSB programming of a second cell that neighbors the first cell in the string select line SSL direction, or neighbor each other in the first horizontal direction (along x direction). This programming method eliminates or mitigates cell coupling that can otherwise occur between cells that neighbor each other in the vertical direction or in the first horizontal direction.

For a three-dimensional device such as BICS and TCAT devices, word lines of the same plane such as those among the first, second, and third layers are typically electrically connected and thus operate as one, common word line on each plane. Thus, unselected memory cells associated with the same word line are also subject to the same programming voltage Vpgm during the programming operation of the selected memory cell, which can adversely impact device lifespan, or device endurance.

Another advantage of programming in the horizontal direction is manifested in a VNAND device configuration where the string active region is in the shape of a vertical bar. FIG. 5 is a diagram illustrating cell-to-cell coupling for a VNAND-device having a vertical active region that is configured in a bar shape. In FIG. 5, it can be seen that opposed vertical channels 202A, 202B are parallel to each other, and spaced apart from each other. Word lines 204A, 204B extend in the horizontal direction, each word line 204A, 204B being on a different level. As the cell pitch, or the distance between opposed, neighboring, cells provided on the vertical channels 202A, 202B decreases, cell-to-cell coupling is relatively high in the vertical bar configuration, in comparison with a VNAND having a cell string active region that is in a vertical pillar or tubular shape. For example, cell-to-cell coupling can occur in the vertical direction, in the first horizontal direction, and in the diagonal direction including both vertical and first horizontal components. Also, in some VNAND devices, two opposing vertically oriented active regions 202A, 202B can be configured to face each other without intervention of conductive material, and thus, a memory cell can be subject to additional cell-to-cell coupling in the second horizontal direction.

FIG. 9 is a schematic diagram illustrating another programming method for multi-bit programming in a three-dimensional memory device by grouping memory cell strings and programming them in the horizontal or vertical direction.

In three dimensional memory devices, strings of a certain number can be grouped. For example, strings associated with string selection lines SSL0 and SSL1 may be grouped in a first group, and strings associated with to string selection lines SSL2 and SSL3 may be grouped in a second group. Even though four strings are illustrated in FIG. 9 for the purpose of illustration, it is understood that other numbers of plurality of strings may constitute a cell array. Referring to FIG. 9, the programming of memory cells of a first group is first conducted and then the programming of memory cells of a second group is conducted. Other groups in the array can be programmed in similar fashion. Memory cells that lie on the same layer or plane can also be grouped together.

All bit lines BLx associated with the same, common, SSL can be selected for the programming operation of memory cells grouped by a certain grouping. Alternatively, memory cells associated with some of bit lines BLx that are associated with a particular SSL, for example, either of even or odd bit lines may be selected and their respective memory cells programmed and the other of even or odd bit lines are subsequently selected and their respective memory cells programmed.

In the embodiment of FIG. 9, a memory cell associated with the first string select line $SSL_{j-1}$ (SSL0 in this figure) is first programmed, followed by a memory cell associated with the neighboring string select line $SSL_j$ (SSL1, in this figure), followed by a memory cell associated with the next neighboring string select line $SSL_{j+1}$ (SSL2, in this figure). While this embodiment illustrates a programming progression in a direction from a lower string select line $SSL_j$ to a neighboring upper string select line $SSL_{j+1}$, the progression can also, in other embodiments, occur in a direction from an upper string select line $SSL_{j+1}$ to a neighboring lower string select line $SSL_j$. In the present embodiment, unwanted cell-to-cell coupling between memory cells is mitigated not only in the word line direction, or vertical direction (along the z axis), but also in the string select line SSL direction, or in the first horizontal direction H1 of extension of the bit lines (along the x axis). A detailed progression of this programming operation will now be provided.

Initially, the memory cells constituting the first cell string coupled to, or associated with, the string select line $SSL_0$ are selected for programming by enabling the string select line $SSL_0$. The LSB of the data to be programmed in the memory cell connected to SSL0 and in the first layer is programmed, as indicated by program number '1'.

Next, the memory cells constituting the second cell string that are associated with the string select line $SSL_1$ are selected for programming by enabling the string select line $SSL_1$. The LSB of the data to be programmed in the memory cell connected to SSL1 and in the first layer is programmed, as indicated by program number '2'.

Next, the memory cells constituting the first cell string associated with the string select line $SSL_0$ are selected for programming by enabling the string select line $SSL_0$. The LSB of the data to be programmed in the memory cell connected to SSL0 and in a second layer is programmed, as indicated by program number '3'.

Next, the memory cells constituting the second cell string that are associated with the string select line $SSL_1$ are selected for programming by enabling the string select line $SSL_1$. The LSB of the data to be programmed in the memory cell connected to SSL1 and in the second layer is programmed, as indicated by program number '4'.

Next, the memory cells constituting the first cell string coupled to, or associated with, the string select line $SSL_0$ are selected for programming by enabling the string select line $SSL_0$. The MSB of the data to be programmed in the memory cell connected to SSL0 and in the first layer is programmed, as indicated by program number '5'.

Next, the memory cells constituting the second cell string that are associated with the string select line $SSL_1$ are selected for programming by enabling the string select line $SSL_1$. The MSB of the data to be programmed in the memory cell connected to SSL1 and in the first layer is programmed, as indicated by program number '6'.

Next, the memory cells constituting the first cell string associated with the string select line $SSL_0$ are selected for programming by enabling the string select line $SSL_0$. The LSB of the data to be programmed in the memory cell connected to SSL0 and in a third layer is programmed, as indicated by program number '7'.

Next, the memory cells constituting the second cell string that are associated with the string select line $SSL_1$ are selected for programming by enabling the string select line $SSL_1$. The LSB of the data to be programmed in the memory cell connected to SSL1 and in the third layer is programmed, as indicated by program number '8'.

Next, the memory cells constituting the first cell string coupled to, or associated with, the string select line $SSL_0$ are selected for programming by enabling the string select line $SSL_0$. The MSB of the data to be programmed in the memory cell connected to SSL0 and in the second layer is programmed, as indicated by program number '9'.

Next, the memory cells constituting the second cell string that are associated with the string select line $SSL_1$ are selected for programming by enabling the string select line $SSL_1$. The MSB of the data to be programmed in the memory cell connected to SSL1 and in the second layer is programmed, as indicated by program number '10'.

Following the programming of memory cells in the first group, associated with string selection lines SSL0, SSL1 and as represented by program numbers '1'-'12', programming of memory cells in the second group associated with string selection lines SSL2, SSL3 and represented by program numbers '13'-'24' is performed. Programming of additional memory cells in the array continues in this manner.

Referring to the above programming progression, program number '2' of the associated first memory cell is performed before program number '3' of the associated second memory cell. This is followed by the second programming of the first memory cell by program number '6' According to this scenario, the first and second memory cells can be said to neighbor each other in a "diagonal" direction; in this case, both in the horizontal direction along the x-axis and in the vertical direction along the y-axis. In other programming operations, the first and second cells being programmed can be said to neighbor each other in other diagonal directions, for example, in both the horizontal direction along the z-axis and in the vertical direction along the y-axis, and in both the horizontal direction along the x-axis and the horizontal direction along the z-axis.

According to the embodiment of FIG. 9, a multi-bit programming operation is performed in a manner that ensures that MSB programming of a first cell does not occur prior to LSB programming of a second cell that neighbors the first cell in the word-line direction, or in the vertical direction. The multi-bit programming operation of FIG. 9 is also further performed in a manner that ensures that MSB programming of a first cell does not occur prior to LSB programming of a second cell that neighbors the first cell in the string select line SSL direction, or in the first horizontal direction (along the x-axis). This programming method eliminates or mitigates cell coupling that can otherwise occur between cells that neighbor each other in the vertical direction or neighbor each other in the first horizontal direction.

For effective and efficient utilization of a plurality of memory cells, cell arrays can be grouped into relatively small sub-blocks. This multi-bit programming by grouping some portions of cell array is in conformity with such grouping of the memory cells of the array into sub-blocks.

FIG. 10 is a schematic diagram illustrating another programming method for multi-bit programming in a three-dimensional memory device.

According to certain embodiments, multi-bit programming memory cells of strings may be performed in alternating or repeating order. For example, referring to FIG. 10, LSB programming of a memory cell of a cell string associated with SSL0 and of a first layer is first performed as represented by program number '1', and then LSB programming of a memory cell of a cell string associated with SSL2 and of the first layer is performed as represented by program number '2'. Next, LSB programming of a memory cell of a cell string associated with SSL1 and of the first layer is performed as represented by program number '2'. This is followed by LSB programming of a memory cell of a cell string associated with SSL3 and of the first layer. Following LSB programming of memory cells of the first layer according to program numbers '1'-'4', LSB programming of memory cells of the second layer is performed in the same order as the LSB programming of memory cells of a first layer, according to program numbers '5'-'8'. Following LSB programming of memory cells of the second layer according to program numbers '5'-'8', MSB programming of memory cells of the first layer are performed in the same order as LSB programming of memory cells of a first layer, according to program numbers '9'-'12'. Programming of memory cells in the array continues in this manner.

According to the embodiment of FIG. 10, a multi-bit programming operation is performed in a manner that ensures that MSB programming of a first cell does not occur prior to LSB programming of a second cell that neighbors the first cell in the word-line direction, or in the vertical direction. The multi-bit programming operation of FIG. 10 is also performed in a manner that ensures that MSB programming of a first cell does not occur prior to LSB programming of a second cell that neighbors the first cell in the string select line SSL, or in the first horizontal direction (along the x axis). This programming method eliminates or alleviates cell coupling that can otherwise occur between cells that neighbor each other in the vertical direction or neighbor each other in the first horizontal direction.

The multi-bit programming operation of the embodiment of FIG. 10 can be applied, for example, to a VNAND having a vertical active channel that is configured in a bar shape, for example, of the type illustrated above in FIG. 5. In such a configuration, referring to FIG. 10, optionally, word lines controlling the programming of cell strings associated with SSL0 and SSL2 can be coupled to each other and word lines controlling the programming of cell strings associated with SST1 and SST3 are coupled to each other. This configuration and programming schedule can help to mitigate cell-to-cell disturbance, in VNAND devices having bar-shaped vertical active regions.

FIG. 11 is a schematic diagram illustrating another programming method for multi-bit programming in a three-dimensional memory device. As illustrated in FIG. 11, multi-bit programming of memory cells of strings can be performed in a repeating order of three. The programming order and operations are otherwise similar to those described above in connection with FIG. 10.

In various embodiments, all bit lines can be selected for this embodiment of multi-bit programming. Alternatively, some of bit lines that are associated with a string selection line SSL, for example, either of even or odd bit lines may be selected for the programming of associated memory cells and then the other of even or odd bit lines are subsequently selected for the programming of associated memory cells.

FIG. 12 is a schematic diagram illustrating another programming method for multi-bit programming in a three-dimensional memory device. As illustrated in FIG. 12, according to another embodiment of the present invention, memory cells can be multi-bit programmed in the horizontal direction of the string selection lines SSL (in the direction along the x-axis)

Initially, the memory cells constituting the first cell string coupled to, or associated with, the string select line $SSL_0$ are selected for programming by enabling the string select line $SSL_0$. The LSB of the data to be programmed in the memory cell associated with $SSL_0$ and in the first layer is programmed, as indicated by program number '1'.

Next, the memory cells constituting the second cell string that are coupled to, or associated with, the string select line $SSL_1$ are selected for programming by enabling the string select line $SSL_1$. The LSB of the data to be programmed in the memory cell associated with $SSL_1$ and in the first layer is programmed, as indicated by program number '2'.

Next, the memory cells constituting the first cell string coupled to, or associated with, the string select line $SSL_0$ are selected for programming by enabling the string select line $SSL_0$. The MSB of the data to be programmed in the memory cell associated with $SSL_0$ and in the first layer is programmed, as indicated by program number '3'.

Next, the memory cells constituting the third cell string that are coupled to, or associated with, the string select line $SSL_2$ are selected for programming by enabling the string select line $SSL_2$. The LSB of the data to be programmed in the memory cell associated with $SSL_2$ and in the first layer is programmed, as indicated by program number '4'.

Next, the memory cells constituting the second cell string that are coupled to, or associated with, the string select line $SSL_1$ are selected for programming by enabling the string select line $SSL_1$. The MSB of the data to be programmed in the memory cell associated with $SSL_1$ and in the first layer is programmed, as indicated by program number '5'.

Next, the memory cells constituting the fourth cell string that are coupled to, or associated with, the string select line $SSL_3$ are selected for programming by enabling the string select line $SSL_3$. The LSB of the data to be programmed in the memory cell associated with $SSL_3$ and in the first layer is programmed, as indicated by program number '6'.

Next, the memory cells constituting the third cell string that are coupled to, or associated with, the string select line $SSL_2$ are selected for programming by enabling the string select line $SSL_2$. The MSB of the data to be programmed in the memory cell associated with $SSL_2$ and in the first layer is programmed, as indicated by program number '7'.

Next, the memory cells constituting the fourth cell string that are coupled to, or associated with, the string select line $SSL_3$ are selected for programming by enabling the string select line $SSL_3$. The MSB of the data to be programmed in the memory cell associated with $SSL_3$ and in the first layer is programmed, as indicated by program number '8'.

Following the programming of memory cells in the first layer, as represented by program numbers '1'-'8', programming of memory cells in the second layer represented by program numbers '9'-'16' is performed. Programming of additional memory cells in the array continues in this manner.

In various embodiments, all bit lines can be selected for this embodiment of multi-bit programming. Alternatively, some of bit lines that are associated with a string selection line SSL, for example, either of even or odd bit lines may be selected for the programming of associated memory cells and then the other of even or odd bit lines are subsequently selected for the programming of associated memory cells.

FIG. 13 is a schematic diagram illustrating another programming method for multi-bit programming in a three-dimensional memory device. In this embodiment, a cell array, or a memory block can be partitioned into a plurality of sub-blocks. In the present example, the memory cells of a memory block MB are partitioned into a first sub-block 100L and a second sub-block 100R. The number of string selection lines SSL0-SSL3 of the first sub-block 100L may be equal to or different from that of the number of string selection lines SSLa-SSLd of the second sub-block 100R. Memory cells in either of sub-blocks 100L, 100R can be programmed according to any of the various programming operations described herein, or, alternatively, according to a combination of the programming operations described herein.

A distinguishable difference in programming speed for programming MSB and LSB data can adversely influence overall device performance. In general, the programming speed of LSB data is higher than the programming speed of MSB data, for a given cell. Thus, as the number of memory cells in an array increases, the programming speed among cells of the same plane within a block may not be uniform. The present embodiment mitigates or eliminates a discrepancy in programming operation speed that can occur due to differences in the programming of LSB and MSB information in the memory by partitioning the array into sub-blocks.

FIG. 14 is a schematic diagram illustrating another programming method for multi-bit programming in a three-dimensional memory device which sub-blocks are formed horizontally. In this embodiment, a cell array, or a memory block can be partitioned into a plurality of horizontal sub-blocks. In the present example, the memory cells of a memory block MB are partitioned into a first sub-block 100T and a second sub-block 100B. The number of layers of memory cells of the first sub-block 100T may be equal to or different from that of the number of layers of memory cells of the second sub-block 100B. Memory cells in either of sub-blocks 100T, 100B can be programmed according to any of the various programming operations described herein, or, alternatively, according to a combination of the programming operations described herein. In modified embodiments of a three dimensional device of the present invention, dummy cell transistors can be employed in certain positions of a given cell string CSTR.

The embodiment of FIG. 14 is suited well for devices in which horizontal grouping is advantageous. For example, this embodiment can be applied to a three dimensional device of the present invention in which one or more dummy cell transistors are disposed at a certain position of the cell string (CSTR) or to a device where one cell block is physically stacked on another cell block.

FIG. 15 is a schematic diagram illustrating another programming method for multi-bit programming in a three-dimensional memory device. In this embodiment, a cell array, or a memory block can be horizontally and vertically partitioned into a plurality of sub-blocks. In the present example, the memory cells of a memory block MB are partitioned into a first sub-block 100Q1, a second sub-block 100Q2, a third sub-block 100Q3, and a fourth sub-block 100Q4. The number of layers of memory cells of one sub-block 100Q1-4 may be equal to or different from that of the number of layers of memory cells of another sub-block 100Q1-4. Also the number of string selection lines SSL of one sub-block 100Q1-4 may be equal to or different from that of the number of string selection lines SSL of another sub-block 100Q1-4. Memory cells in the sub-blocks 100Q1-4 can be programmed according to any of the various programming operations described herein, or, alternatively, according to a combination of the programming operations described herein.

Three dimensional memory devices employing embodiments of the present inventive concepts disclosed herein can be employed in various memory device applications.

FIG. 16 is a block diagram of a memory card that comprises a semiconductor device in accordance with the embodiments of the present invention. The memory card 1200 comprises a memory controller 1220 that generates command and address signals C/A and a memory module 1210 for example, flash memory 1210 that comprises one or a plurality of flash memory devices. The memory controller 1220 comprises a host interface 1223 that transmits and receives command and address signals to and from a host, a controller 1224, and a memory interface 1225 that in turn is transmits and receives the command and address signals to and from the memory module 1210. The host interface 1223, the controller 1224 and memory interface 1225 communicate with controller memory 1221 and processor 1222 via a common bus.

The memory module 1210 receives the command and address signals C/A from the memory controller 1220, and, in response, stores and retrieves data DATA I/O to and from at least one of the memory devices on the memory module 1210. Each memory device comprises a plurality of addressable memory cells and a decoder that receives the receives the command and address signals, and that generates a row signal and a column signal for accessing at least one of the addressable memory cells during programming and read operations.

Each of the components of the memory card 1200, including the memory controller 1220, electronics 1221, 1222, 1223, 1224, and 1225 comprised on the memory controller 1220 and the memory module 1210 can employ memory devices that are programmable according to the inventive concepts disclosed herein.

FIG. 17 is a block diagram of a memory system 1300 that employs a memory module 1310, for example, of the type described herein. The memory system 1300 comprises a processor 1330, random access memory 1340, user interface 1350 and modem 1320 that communicate via a common bus 1360. The devices on the bus 1360 transmit signals to and receive signals from the memory card 1310 via the bus 1360. Each of the components of the memory system 1300, including the processor 1330, random access memory 1340, user interface 1350 and modem 1320 along with the memory card 1310 can employ vertically oriented memory devices of the type disclosed herein. The memory system 1300 can find application in any of a number of electronic applications, for example, those found in consumer electronic devices such as solid state disks (SSD), camera image sensors (CIS) and computer application chip sets.

The memory systems and devices disclosed herein can be packaged in any of a number of device package types, including, but not limited to, ball grid arrays (BGA), chip scale packages (CSP), plastic leaded chip carrier (PLCC) plastic dual in-line package (PDIP), multi-chip package (MCP), wafer-level fabricated package (WFP), and wafer-level processed stock package (WSP).

While embodiments of the inventive concept have been particularly shown and described with references to preferred embodiments thereof, it will be understood by those skilled in the art that various changes in form and details may be made herein without departing from the spirit and scope of the inventive concept as defined by the appended claims.

What is claimed is:

1. A method of programming a nonvolatile memory device including strings extending from intersections of first through nth bit lines (n being an integer of 1 or more) and a plurality of string selection lines, each string including memory cells formed in a direction perpendicular to a substrate to have multiple layers of memory cells, wherein the perpendicular direction is a Y-direction, the string selection lines extend in a Z-direction and the bit lines extend in an X-direction, comprising:

programming a first group of memory cells, corresponding to a part of the plurality of string selection lines, from among the memory cells at the multiple layers; and after the first group of the memory cells is all programmed, programming a second group of memory cells, corresponding to remaining string selection lines, from among the memory cells at the multiple layers, wherein each of the programming a first group of memory cells and the programming a second group of memory cells comprises programming memory cells at each layer of an YZ plane with multi-bit data according to a shadow programming method, and wherein, where memory cells at an Nth layer (N being an integer of 1 or more) of the YZ plane are programmed, remaining memory cells at an XZ plane corresponding to the Nth layer are programmed before memory cells at another layer of the YZ plane are programmed.

2. The program method of claim 1, wherein the part of the plurality of string selection lines comprises at least first, second, and third string selection lines, and wherein the programming a first group of memory cells comprises sequentially performing a first programming operation on first memory cells at a first layer of the YZ plane and defined by the first string selection line and the first through nth bit lines, a second programming operation on second memory cells, defined by the second string selection line and the first through nth bit lines, from among remaining memory cells located at an XZ plane corresponding to the first layer of the YZ plane, and a third programming operation on third memory cells, defined by the third string selection line and the first through nth bit lines, from among the remaining memory cells located at the XZ plane corresponding to the first layer of the YZ plane, and after the first through third programming operations, programming memory cells at a second layer of the YZ plane and in the first group.

3. The program method of claim 2, wherein the remaining string selection lines comprise at least fourth, fifth, and sixth string selection lines, and wherein the programming a second group of memory cells comprises sequentially performing a fourth programming operation on fourth memory cells at a first layer of the YZ plane and defined by the fourth string selection line and the first through nth bit lines, a fifth programming operation on second memory cells, defined by the fifth string selection line and the first through nth bit lines, from among remaining memory cells located at an XZ plane corresponding to the first layer of the YZ plane, and a sixth programming operation on third memory cells, defined by the sixth string selection line and the first through nth bit lines, from among the remaining memory cells located at the XZ plane corresponding to the first layer of the YZ plane, and after the fourth through sixth programming operations, programming memory cells at a second layer of the YZ plane and in the second group.

4. The program method of claim 3, wherein the bit lines are arranged to be vertical to the YZ plane, and the bit lines are activated simultaneously when memory cells of the Nth layer of the YZ plane in the first group or the second group are programmed.

5. The program method of claim 3, wherein the bit lines are arranged to be vertical to the YZ plane and are divided into a first group and a second group, and the bit lines are activated by a group unit when memory cells of the Nth layer of the YZ plane are programmed.

6. The program method of claim 3, wherein, in the shadow programming method on each of the first and second groups, before upper bit data is programmed at memory cells at the Nth layer of the YZ plane, memory cells at a (N−1)th layer of the YZ plane are programmed by lower and upper bit data and memory cells at a (N+1)th layer of the YZ plane are programmed by lower bit data.

*7. A method of programming a three dimensional non-volatile memory device including a plurality of memory cells, the plurality of memory cells including a first memory cell, a second memory cell, a third memory cell and a fourth memory cell, each of the plurality of memory cells being a multi-bit memory cell that is configured to store least significant bit (LSB) data and most significant bit (MSB) data, the method comprising:*

*programming the first memory cell with first LSB data and the second memory cell with second LSB data;*

*after programming the first memory cell with the first LSB data and the second memory cell with the second LSB data, programming the third memory cell with third LSB data and the fourth memory cell with fourth LSB data;*

*programming the first memory cell with first MSB data and the second memory cell with second MSB data; and*

*after programming the first memory cell with the first MSB data and the second memory cell with the second MSB data, programming the third memory cell with third MSB data and the fourth memory cell with fourth MSB data,*

*wherein the first memory cell and the second memory cell are connected to a first wordline,*

*the third memory cell and the fourth memory cell are connected to a second wordline,*

*the first memory cell and the third memory cell are included in a first string and stacked perpendicular to a substrate,*

*the second memory cell and the fourth memory cell are included in a second string and stacked perpendicular to the substrate, and*

*the first string and the second string are connected to a first bit line.*

*8. The method of claim 7, wherein the programming the first memory cell with first MSB data and the second memory cell with the second MSB data is performed before the programming the third memory cell with the third LSB data and the fourth memory cell with the fourth LSB data is performed.*

*9. The method of claim 8, wherein the programming the first memory cell with the first LSB data and the second memory cell with the second LSB data includes:*

*programming the first memory cell with the first LSB data; and*

*programming the second memory cell with the second LSB data after the programming the first memory cell with the first LSB data.*

*10. The method of claim 9, wherein the programming the first memory cell with the first MSB data and the second memory cell with the second MSB data includes:*

*programming the first memory cell with the first MSB data; and*

*programming the second memory cell with the second MSB data after the programming the first memory cell with the first MSB data.*

*11. The method of claim 7, wherein a third string and a fourth string are connected to the first bit line,*

*the plurality of memory cells include a fifth memory cell and a sixth memory cell that are connected to the first wordline, the fifth memory cell being included in the third string, the sixth memory cell being included in the fourth string, and*

*programming the fifth memory cell with fifth LSB data and the sixth memory cell with sixth LSB data before the programming the third memory cell with the third LSB data and the fourth memory cell with the fourth LSB data.*

*12. The method of claim 7, wherein a first ground select transistor and a first string select transistor are included in the first string,*

*a second ground select transistor and a second string select transistor are included in the second string,*

*the first string select transistor and the second string select transistor are connected to the first bit line,*

*the first memory cell and the third memory cell are positioned between the first ground select transistor and the first string select transistor,*

*the second memory cell and the fourth memory cell are positioned between the second ground select transistor and the second string select transistor,*

*a distance between the third memory cell and the first ground select transistor is greater than a distance between the first memory cell and the first ground select transistor, and*

*a distance between the fourth memory cell and the second ground select transistor is greater than a distance between the second memory cell and the second ground select transistor.*

*13. The method of claim 12, wherein the first ground select transistor and the second ground select transistor are connected to a first ground select line.*

*14. The method of claim 7, wherein the programming the first memory cell with first MSB data and the second memory cell with the second MSB data is performed after the programming the third memory cell with the third LSB data and the fourth memory cell with the fourth LSB data is performed.*

*15. A method of programming a three dimensional non-volatile memory device including a plurality of memory cells, the plurality of memory cells including a first memory cell, a second memory cell, a third memory cell and a fourth memory cell, each of the plurality of memory cells being a multi-bit memory cell that is configured to store least significant bit (LSB) data and most significant bit (MSB) data, the method comprising:*

*programming the first memory cell with first LSB data and first MSB data;*

*programming the second memory cell with second LSB data and second MSB data;*

*programming the third memory cell with third LSB data and third MSB data; and*

*programming the fourth memory cell with fourth LSB data and fourth MSB data,*

*wherein the third LSB data and the fourth LSB data are programmed after the first LSB data and the second LSB data,*

*the third MSB data and the fourth MSB data are programmed after the first MSB data and the second MSB data, and*

*the first MSB data and the second MSB data are programmed after the third LSB data and the fourth LSB data, and*

*wherein the first memory cell and the second memory cell are connected to a first wordline,*

*the third memory cell and the fourth memory cell are connected to a second wordline,*

*the first memory cell and the third memory cell are included in a first string and stacked perpendicular to a substrate,*

*the second memory cell and the fourth memory cell are included in a second string and stacked perpendicular to the substrate, and*

*the first string and the second string are connected to a first bit line.*

*16. The method of claim 15, wherein after the programming the first memory cell with the first LSB data, the programming the second memory cell with the second LSB data is performed.*

*17. The method of claim 15, wherein a third string and a fourth string are connected to the first bit line,*

*the plurality of memory cells include a fifth memory cell and a sixth memory cell that are connected to the first wordline, the fifth memory cell being included in the third string, the sixth memory cell being included in the fourth string, and*

*programming the fifth memory cell with fifth LSB data and the sixth memory cell with sixth LSB data before the programming the third memory cell with the third LSB data and the fourth memory cell with the fourth LSB data.*

*18. The method of claim 15, wherein a first ground select transistor and a first string select transistor are included in the first string,*

*a second ground select transistor and a second string select transistor are included in the second string,*

*the first string select transistor and the second string select transistor are connected to the first bit line,*

*the first memory cell and the third memory cell are positioned between the first ground select transistor and the first string select transistor,*

*the second memory cell and the fourth memory cell are positioned between the second ground select transistor and the second string select transistor,*

*a distance between the third memory cell and the first ground select transistor is greater than a distance between the first memory cell and the first ground select transistor, and*

*a distance between the fourth memory cell and the second ground select transistor is greater than a distance between the second memory cell and the second ground select transistor.*

*19. The method of claim 18, wherein the first ground select transistor and the second ground select transistor are connected to a first ground select line.*

*20. The method of claim 15, wherein the programming the first memory cell with the first MSB data and the second memory cell with the second MSB data includes:*

*programming the first memory cell with the first MSB data; and*

*programming the second memory cell with the second MSB data after the programming the first memory cell with the first MSB data.*

*21. A method of operating a memory system including a three dimensional nonvolatile memory device and a controller, the three dimensional nonvolatile memory device including a plurality of memory cells, the plurality of memory cells including a first memory cell, a second memory cell, a third memory cell and a fourth memory cell, each of the plurality of memory cells being a multi-bit memory cell that is configured to store two bit data, the method comprising:*

*providing, by the controller, first through eighth page data to the three dimensional nonvolatile memory device, the first through eighth page data corresponding to a first through eighth addresses that gradually increase, first through eighth bit data being included in a corresponding one of the first through eighth page data;*

*programming the first cell and the second cell with the first through fourth bit data included in the first through fourth page data corresponding to the first through fourth addresses; and*

*after the programming the first cell and the second cell, programming the third cell and the fourth cell with the fifth through eighth bit data included in the fifth through eighth page data corresponding to the fifth through eighth addresses,*

*wherein the first memory cell and the second memory cell are connected to a first wordline,*

*the third memory cell and the fourth memory cell are connected to a second wordline,*

*the first memory cell and the third memory cell are included in a first string and stacked perpendicular to a substrate,*

*the second memory cell and the fourth memory cell are included in a second string and stacked perpendicular to the substrate, and*

*the first string and the second string are connected to a first bit line.*

*22. The method of claim 21, wherein a first ground select transistor and a first string select transistor are included in the first string,*

*a second ground select transistor and a second string select transistor are included in the second string,*

*the first string select transistor and the second string select transistor are connected to the first bit line,*

*the first memory cell and the third memory cell are positioned between the first ground select transistor and the first string select transistor,*

*the second memory cell and the fourth memory cell are positioned between the second ground select transistor and the second string select transistor,*

*a distance between the third memory cell and the first ground select transistor is greater than a distance between the first memory cell and the first ground select transistor, and*

*a distance between the fourth memory cell and the second ground select transistor is greater than a distance between the second memory cell and the second ground select transistor.*

*23. The method of claim 22, wherein the first ground select transistor and the second ground select transistor are connected to a first ground select line.*

* * * * *